United States Patent
Lee et al.

(10) Patent No.: US 8,080,480 B2
(45) Date of Patent: Dec. 20, 2011

(54) METHOD OF FORMING FINE PATTERNS AND MANUFACTURING SEMICONDUCTOR LIGHT EMITTING DEVICE USING THE SAME

(75) Inventors: Jong Ho Lee, Gyunggi-do (KR); Moo Youn Park, Gyunggi-do (KR); Soo Ryong Hwang, Gyunggi-do (KR); Il Hyung Jung, Seoul (KR); Gwan Su Lee, Gyunggi-do (KR); Jin Ha Kim, Seoul (KR)

(73) Assignee: Samsung LED Co., Ltd., Gyunggi-do (KR)

( * ) Notice: Subject to any disclaimer, the term of this patent is extended or adjusted under 35 U.S.C. 154(b) by 567 days.

(21) Appl. No.: 12/239,122

(22) Filed: Sep. 26, 2008

(65) Prior Publication Data
US 2009/0087994 A1    Apr. 2, 2009

(30) Foreign Application Priority Data

Sep. 28, 2007  (KR) .................. 10-2007-0098320
Sep. 1, 2008   (KR) .................. 10-2008-0086063

(51) Int. Cl.
*H01L 21/302* (2006.01)
(52) U.S. Cl. ............ 438/753; 438/719; 438/754; 216/99
(58) Field of Classification Search .................. 438/706, 438/719, 720, 745, 753, 7, 713, 754; 216/99, 216/100
See application file for complete search history.

(56) References Cited

U.S. PATENT DOCUMENTS

| 5,779,924 | A | 7/1998 | Krames et al. |
| 6,958,494 | B2 | 10/2005 | Lin et al. |
| 7,615,398 | B2 * | 11/2009 | McKenzie et al. ............... 438/65 |
| 2005/0067625 | A1 | 3/2005 | Hata |
| 2005/0161681 | A1 * | 7/2005 | Okuyama et al. ............... 257/79 |

(Continued)

FOREIGN PATENT DOCUMENTS

| JP | 10-004209 | 1/1998 |
| JP | 3108484 U | 2/2005 |
| JP | 2005-108982 | 4/2005 |

(Continued)

OTHER PUBLICATIONS

Japanese Office Action, w/ English translation thereof, issued in Japanese Patent Application No. JP 2008-248787 dated Aug. 16, 2011.

*Primary Examiner* — Lan Vinh
(74) *Attorney, Agent, or Firm* — McDermott Will & Emery LLP

(57) ABSTRACT

A method of forming a fine pattern begins with providing a c-plane hexagonal semiconductor crystal. A mask having a predetermined pattern is formed on the semiconductor crystal. The semiconductor crystal is dry-etched by using the mask to form a first fine pattern on the semiconductor crystal. The semiconductor crystal including the first fine pattern is wet-etched to expand the first fine pattern in a horizontal direction to form a second fine pattern. The second fine pattern obtained in the wet-etching the semiconductor crystal has a bottom surface and a sidewall that have unique crystal planes, respectively. The present fine-pattern forming process can be advantageously applied to a semiconductor light emitting device, particularly, to a phonic crystal structure required to have fine patterns or a structure using a surface plasmon resonance principle.

26 Claims, 16 Drawing Sheets

U.S. PATENT DOCUMENTS

| | | |
|---|---|---|
| 2006/0054898 A1 | 3/2006 | Lai et al. |
| 2006/0081834 A1* | 4/2006 | Tada et al. .................. 257/14 |
| 2007/0181889 A1 | 8/2007 | Orita |
| 2008/0105954 A1 | 5/2008 | Kodama et al. |
| 2008/0121913 A1* | 5/2008 | McKenzie et al. ............ 257/98 |

FOREIGN PATENT DOCUMENTS

| | | |
|---|---|---|
| JP | 2006-339656 | 12/2006 |
| JP | 2007-116057 | 5/2007 |
| JP | 2007-214260 | 8/2007 |
| JP | 2008-108844 | 5/2008 |

* cited by examiner

METHOD OF FORMING FINE PATTERNS AND MANUFACTURING SEMICONDUCTOR LIGHT EMITTING DEVICE USING THE SAME

CROSS-REFERENCE TO RELATED APPLICATIONS

This application claims the priority of Korean Patent Application Nos. 2007-98320 filed on Sep. 28, 2007 and 2008-86063 filed on Sep. 1, 2008 in the Korean Intellectual Property Office, the disclosure of which is incorporated herein by reference.

BACKGROUND OF THE INVENTION

1. Field of the Invention

The present invention relates to a fine-pattern forming process, and more particularly, to a process for manufacturing a semiconductor light emitting device including the fine patterns to improve light efficiency.

2. Description of the Related Art

Various semiconductor devices are being fabricated, such as light emitting diodes, laser diodes, photodiodes and transistors based on semiconductors.

For specific functions, the semiconductor device may be required to have fine patterns such as periodic/non-periodic patterns at a predetermined region. Such fine patterns may be formed by etching a semiconductor surface using a known etching process.

In the case of a nitride semiconductor light emitting device, light-extraction efficiency is limited due to a difference in a refractive index between the outside and a nitride semiconductor. In order to overcome this limitation, a fine-pattern structure may be formed in a surface of the nitride semiconductor light emitting device.

A photonic crystal structure having fine periodic grating patterns is being actively studied in order to improve luminance of a semiconductor light emitting device. Also, similar fine grating patterns are being adopted for a method for improving luminance by using a principle of surface Plasmon resonance.

However, an etching process used in this patterning process has limitations in forming fine patterns on a semiconductor surface. The limitations vary according to an etching method being used.

For example, dry etching such as reactive ion etching (RIE) and inductively coupled plasma reactive ion etching (ICP-RIE) can secure precise and reproducible patterns because it allows power control and has anisotropy. However, the dry etching has limitations in that properties of a semiconductor surface easily deteriorate due to a physical bombardment with ions or neutral atoms during the dry etching. Even if a thin film of a material, which is not p-type GaN, is deposited on a p-type GaN layer and then the thin film is patterned using dry etching, it is difficult to prevent damage to the p-type GaN layer placed at a portion where the thin film is removed.

A solid line of FIG. 1 represents a current-voltage (I-V) characteristic of a nitride semiconductor light emitting device purposely damaged by ICP-RIE using a halogen gas before an electrode is formed on a p-type GaN surface. A dotted line indicated by 'X' represents an I-V characteristic of a nitride semiconductor light emitting device before the damage occurs, which is different from an undamaged nitride LED indicated by '♦'. In the nitride semiconductor light emitting device damaged by the dry etching, a current begins to flow from a low voltage. However, this current is not the one that is generated by the normal carrier recombination but a leakage current that generates almost no light.

Therefore, research is ongoing on a method for recovering an original state of a crystal from damage caused by dry etching. However, because of nitrogen vacancy, a surface of a p-type GaN layer undergoes a change in its conductivity type into an n-type during an etching process. For this reason, using general post-processing cannot contribute to recovering the damaged crystal. The conductivity type conversion becomes a fatal defect in a p-n junction diode.

Unlike the dry etching, wet etching does not cause damage to a semiconductor surface such as p-type GaN. However, the wet etching also has limitations in that a specific plane (e.g., a c-plane) of a nitride single crystal is not etched almost at all, and precise patterning is difficult to achieve. Also, if an etching depth is excessive, a top end of a thin film is completely removed, and thus a photoresist layer serving as a mask is separated.

SUMMARY OF THE INVENTION

An aspect of the present invention provides a method of forming fine patterns, which can minimize a damaged area resulting from dry etching by using a horizontal etching characteristic of a {0001} c-plane hexagonal semiconductor crystal after the dry etching.

An aspect of the present invention also provides a method of manufacturing a semiconductor light emitting device having fine patterns, which has improved optical output by using the method of forming fine patterns.

According to an aspect of the present invention, there is provided a method of forming a fine pattern, including: providing a c-plane hexagonal semiconductor crystal; forming a mask having a predetermined pattern on the semiconductor crystal; dry-etching the semiconductor crystal by using the mask to form a first fine pattern on the semiconductor crystal; and wet-etching the semiconductor crystal including the first fine pattern to expand the first fine pattern in a horizontal direction to form a second fine pattern. The second fine pattern obtained in the wet-etching the semiconductor crystal may have a bottom surface and a sidewall that have unique crystal planes, respectively.

The semiconductor crystal substrate may be formed of a p-type nitride semiconductor that may be damaged by dry etching.

Since a bottom surface, which is a c-plane may not be etched almost at all in the wet etching, a bottom surface obtained in the forming a first fine pattern may have the same c-plane that a bottom surface obtained in the forming a second fine pattern has.

The pattern of the mask may include a plurality of line patterns formed in a <11-20> orientation of the semiconductor crystal and arranged along a <1-100> orientation, and the sidewall of the second fine pattern may have an m-plane.

The pattern of the mask may include a plurality of line patterns formed in a <1-100> orientation of the semiconductor crystal and arranged in a <11-20> orientation. In the current embodiment, as the wet etching further proceeds, the line patterns may become uneven at their surfaces and then may be partially thinned and thus provided as dotted patterns. Furthermore, if necessary, even the dotted patterns may be completely etched and removed by performing additional etching. Consequently, this etching method may be used as a method for controlling a thickness of a semiconductor layer.

The pattern of the mask may include a plurality of fine holes, and the second fine pattern may include a plurality of hexagonal fine holes. An inner wall of the hole may have a crystal plane that is varied over time of wet etching, which is a secondary etching process. The forming a second fine pattern may include performing wet-etching such that the sidewall of the second fine pattern has an m-plane component and an s-plane component. Also, by continuing the wet etching, an inner sidewall of the hole may include an r-plane component, which is more stable and can provide a lower coverage.

The second fine pattern may have a pillar structure.

According to needs, the forming a second fine pattern may be performed before or after the mask is removed.

According to another aspect of the present invention, there is provided a method of manufacturing a semiconductor light emitting device, which can be advantageously applied to a phonic crystal structure required to have fine patterns or a structure using a surface plasmon resonance principle.

The method of manufacturing a semiconductor light emitting device, includes: providing a multilayered semiconductor structure including a first conductivity type semiconductor layer, a second conductivity type semiconductor layer, and an active layer between the first and second conductivity type semiconductor layers; forming a mask having a predetermined pattern on the second conductivity type semiconductor layer of the multilayered semiconductor structure; dry-etching the second conductivity type semiconductor layer by using the mask to form a first fine pattern on the second conductivity type semiconductor layer; wet-etching the second conductivity type semiconductor layer including the first fine pattern to expand the first fine pattern in a horizontal direction to form a second fine pattern; and forming a first electrode and a second electrode in a state where the mask has been removed, the first and second electrode respectively being connected with the first and second conductivity type semiconductor layers. The second conductivity type semiconductor layer may be a c-plane hexagonal semiconductor crystal, and the second fine pattern obtained from the wet-etching the second conductivity type semiconductor layer may have a bottom surface and a sidewall that have unique crystal planes, respectively.

The second fine pattern formed at the second conductivity type semiconductor layer may serve as a photonic crystal structure that improves light extraction efficiency by attenuating a total reflection effect caused by a low refractive index of the ambient air or a sealant when light generated at the active layer is extracted to the outside through a surface of the p-type nitride semiconductor layer.

For a preferable phonic crystal structure, a light transmissive conductive layer may be formed on the second conductivity type semiconductor layer including the second fine pattern. For example, a light transmissive metal layer or a light transmissive conductive oxide layer such as ITO may be formed.

To form a structure using a surface plasmon resonance principle, the forming a second electrode may include forming a highly reflective metal layer such as Ag on the second conductivity type semiconductor layer including the second fine pattern. The highly reflective metal layer may have a multilayered structure.

The second conductivity type semiconductor layer may have a thickness allowing energy generated by recombination of an electron-hole pair injected to the active layer to excite a surface plasmon at an interface between the second conductivity type semiconductor layer and the highly reflectively metal layer.

The second conductivity type semiconductor layer may have a thickness of about 50 nm or less between the second fine pattern and the active layer.

The manufacturing method according to the present invention may be advantageously applied to a light emitting device including the multilayered semiconductor structure of a nitride semiconductor. In this case, the second conductivity type semiconductor layer may be a p-type nitride semiconductor layer.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

FIGS. 2A through 2D are cross-sectional views for explaining a fine-pattern forming process using horizontal wet etching according to an exemplary embodiment of the present invention.

Figure 2A:
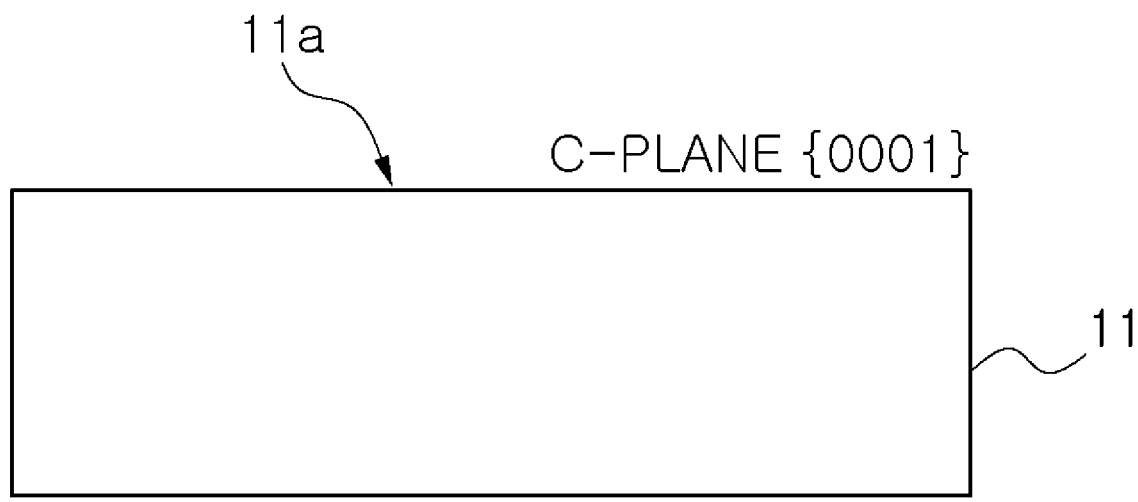
FIGS. 2A through 2D are cross-sectional views for explaining a fine-pattern forming process using horizontal wet etching according to an exemplary embodiment of the present invention.

As shown in FIG. 2A, the fine-pattern forming process according to the current embodiment begins with providing a c-plane hexagonal semiconductor crystal 11.

The semiconductor crystal 11 may be a nitride semiconductor such as GaN or another known semiconductor in a hexagonal system. Particularly, the semiconductor base 11 may be a p-type nitride layer which is susceptible to damage from dry etching. According to the current embodiment, a hexagonal semiconductor crystal having an upper surface provided as a c-plane {0001} is used.

Figure 2B:
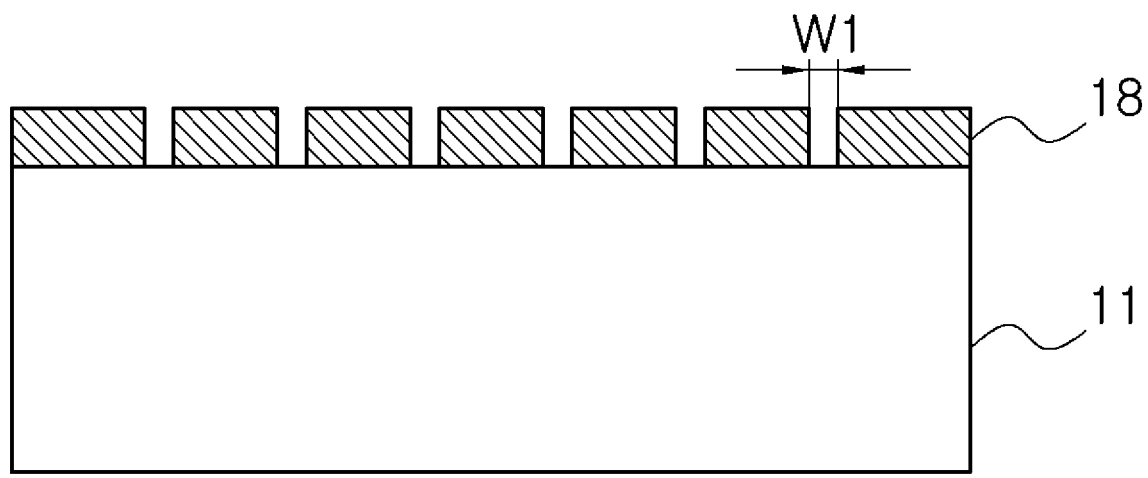

Thereafter, as shown in FIG. 2B, a mask 18 having predetermined patterns is formed on the semiconductor crystal 11.

The mask 18 may be a photoresist pattern. In this process, the mask 180 having desired patterns may be formed by applying photoresist on an upper surface of the semiconductor crystal 11, and then performing a general lithography process or a holographic lithography process thereon.

The patterns may be periodic patterns if necessary, but patterns of the mask 18 used for the present invention may vary. For example, the patterns may be periodic patterns such as one-dimensional line patterns and two-dimensional triangular or rectangular grating patterns, quasi-periodic patterns having low short-range periodicity and high long-range periodicity, or non-periodic patterns.

The size and shape of the patterns may vary even if the periodicity or quasi-periodicity is maintained. This is because anisotropic wet etching process (horizontal direction in the present invention) is performed after the dry etching using a mask. This will now be described in more detail with reference to FIGS. 2C and 2D.

A hybrid etching process which is a combination of primary dry etching and secondary wet etching is used in the current fine-pattern forming process.

Figure 2C:
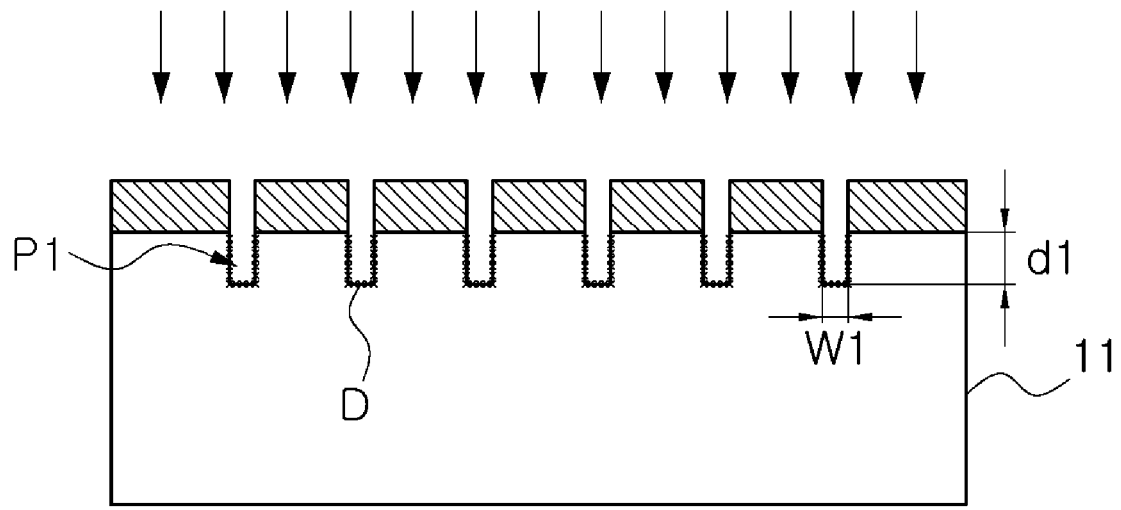

Referring to FIG. 2C, the semiconductor crystal 11 is dry-etched by using the mask 18, thereby forming first fine patterns P1. The first fine pattern P1 is obtained in the current process by dry-etching the semiconductor crystal 11 up to a width corresponding to a width W1 of an opening of the mask 18 and up to a predetermined depth d1 of the semiconductor crystal 116. The depth of the first fine pattern P1 obtained from the dry etching is almost equal to a depth of a final fine pattern P2 of FIG. 2D. However, the width W1 of the first pattern P1 (or the size of the pattern) is smaller than a width of the final fine pattern P2. This will now be described in more detail with reference to FIG. 2D.

As described above, in the current process, ions and neutral atoms used in the dry etching cause a damaged area D over the entire surface of the first fine pattern P1 of the semiconductor crystal 11. That is, an area D where the crystal is directly exposed by the dry etching and thus damaged is present not only in a bottom surface but also in a sidewall of the first fine pattern P1. However, this may be minimized by a wet etching process of FIG. 2D.

Figure 2D:
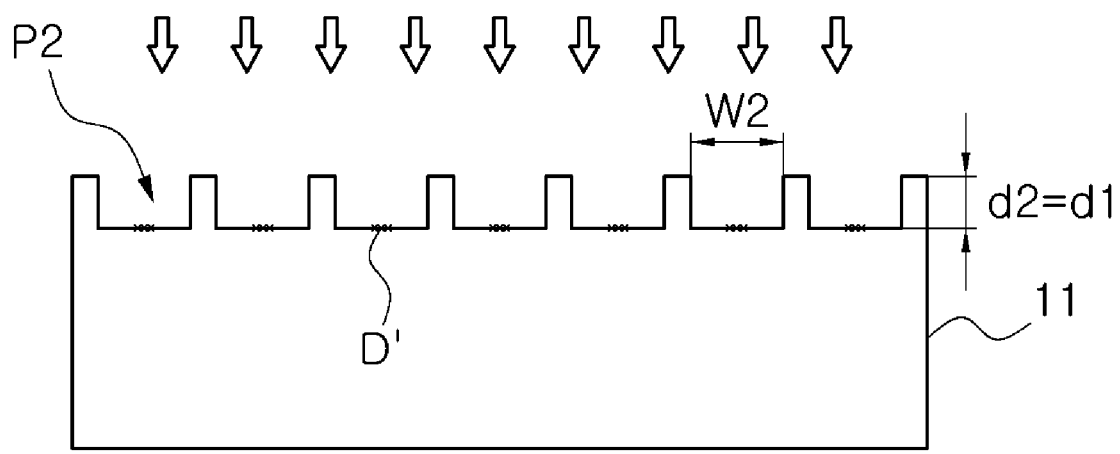

In a process of FIG. 2D, the semiconductor crystal 11 including the first fine patterns P1 is wet-etched. In this embodiment, the wet etching is performed after the mask 18 is removed. However, the present invention is not limited thereto, and the mask 18 may be removed after the wet etching process.

The wet etching proceeds in a horizontal direction of the first fine pattern P1 because it does not affect the stable c-plane almost at all. The horizontal wet etching continues until a sidewall becomes a specific crystal plane. Since an etch rate is significantly lowered at the specific crystal plane, the wet etching may be performed with high reproducibility.

The first fine pattern P1 is expanded in its horizontal direction, and thus may become a second fine pattern P1 having a sidewall of a unique crystal plane. Consequently, the second fine pattern P2 may have a depth d2 which is equal to the depth d1 of the first fine pattern P1 and a width W2 which is wider than the width W1 of the first fine pattern P1.

In this process, as shown in FIG. 2D, a damaged area may not be generated or removed in newly exposed sidewalls and a bottom surface obtained by the horizontal expansion of the first fine pattern P1. Thus, a damaged area D' remains only in an area corresponding to a bottom surface of the first fine pattern P1.

Thus, the second fine pattern P2 may contribute to minimizing a ratio of the damaged area D' to the entire exposed area. By using this principle, a mask pattern design and a dry etching process may be controlled so as to further lower the ratio of the damaged area.

Specifically, by reducing the width W1 of the mask 18 and increasing the depth d1 of the first fine pattern P1, a new area obtained by the second fine pattern P2 can be increased while an area of a damaged bottom surface corresponding to the first fine pattern P1 is decreased.

Consequently, the ratio of the damaged area D' with respect to the entire exposed area of the second fine pattern P2 can be significantly reduced, and thus influences such as deterioration of electrical properties caused by the damaged area resulting from the dry etching can be substantially prevented.

According to the present invention, a bottom surface of the first fine pattern obtained by the dry etching may be a c-plane which is the same as the upper surface of the semiconductor crystal. Since the c-plane is a very stable crystal plane, the bottom surface of the first fine pattern is not etched almost at all even when the sidewall thereof is being wet-etched. Accordingly, it can be seen that the depth of the second fine pattern is determined by the depth of the first fine pattern, and the depth of the final fine pattern can be precisely controlled through the dry etching.

Also, the horizontal wet etching according to the current embodiment of the present invention has a very low etch rate when a sidewall exposed by the wet etching becomes a specific crystal plane. For example, in the case of a nitride single crystal, a sidewall maybe an s-plane {1-101}, an m-plane {1-100} or an r-plane {1-102}.

Accordingly, since the wet etching process is a self-terminating process, which stops by itself, it is very advantageous in securing process uniformity or high reproducibility.

The crystal orientation of the wet etching as well as mask patterns plays an important role in obtaining the shape and size of the final pattern in the present invention. The crystal orientation may be selected by a mask pattern formed on a semiconductor crystal to be etched.

That is, since wet etching rates vary according to a crystal plane, various patterns may be obtained according to which crystal plane is exposed at a sidewall of a crystal pattern exposed by a mask pattern (see embodiments 1A and 1B).

Particularly, the present inventor found that a fine pattern of a hexagonal hole can be obtained by forming a rough circular hole by dry etching and then wet-etching it in a horizontal direction. The fine pattern has a size of sub-micrometer and may have a hexagonal shape having each side forming a sharp angle of 120° with respect to an adjacent side (see embodiment 1C). This may be considered as a unique characteristic of the present invention that no other related art semiconductor etching methods have been unable to achieve.

Furthermore, as mentioned above, each crystal plane exposed in the form of a hexagon may be different according to wet etching. Particularly, since the crystal plane of the sidewall may be inclined according to wet-etching conditions, a sidewall having a coverage facilitating deposition of an electrode material may be provided.

Operations and effects of various embodiments of the present invention will now be described in more detail.

Embodiment 1A

According to the current embodiment, a mask having line patterns formed in a <11-20> orientation and arranged in a <1-100> orientation is formed on a c-plane GaN semiconductor crystal. A period of the line patterns is set to about 0.6 μm. Thereafter, dry etching is performed up to a depth of about 0.1 μm, and then the mask is removed (see FIG. 3A).

Thereafter, wet etching using a 4M KOH aqueous solution is performed at about 100° C. for about 10 minutes, then an observation is made using a scanning electron microscope, and then the wet etching is further performed for about 20 minutes (total 30 minutes).

Figure 3A:
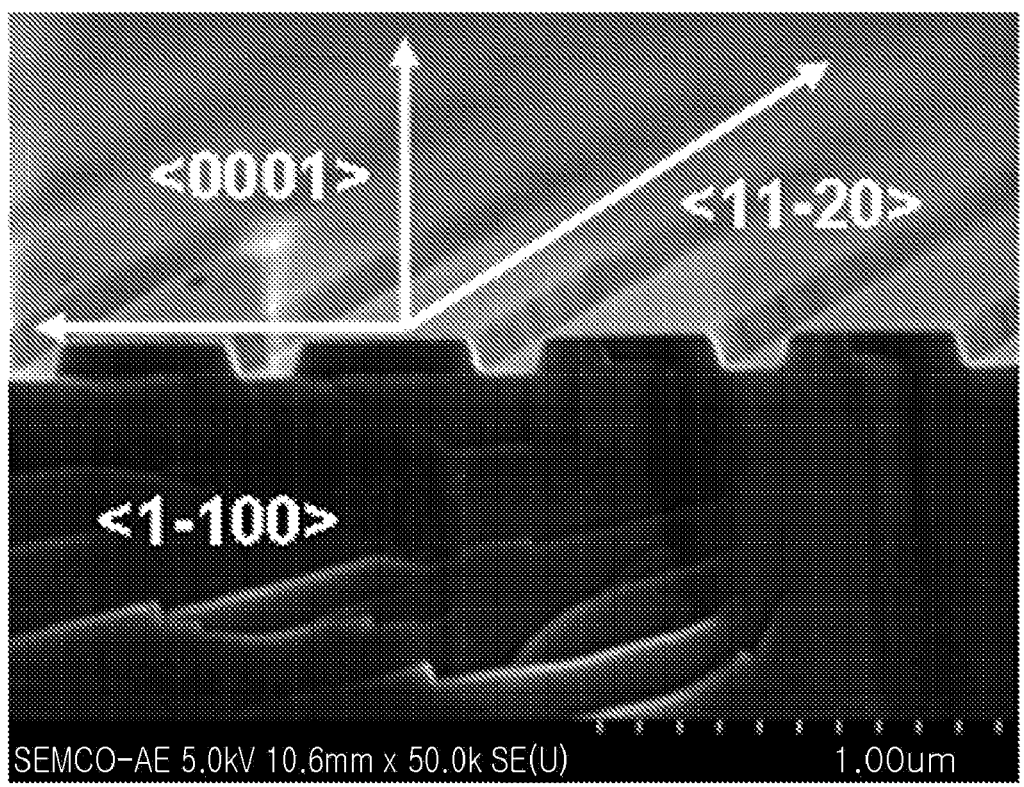
FIGS. 3A through 3C are scanning electron microscope (SEM) images showing pattern changes over time of horizontal wet etching in a fine-pattern forming process according to an exemplary embodiment (embodiment 1A) of the present invention.
Figure 3B:
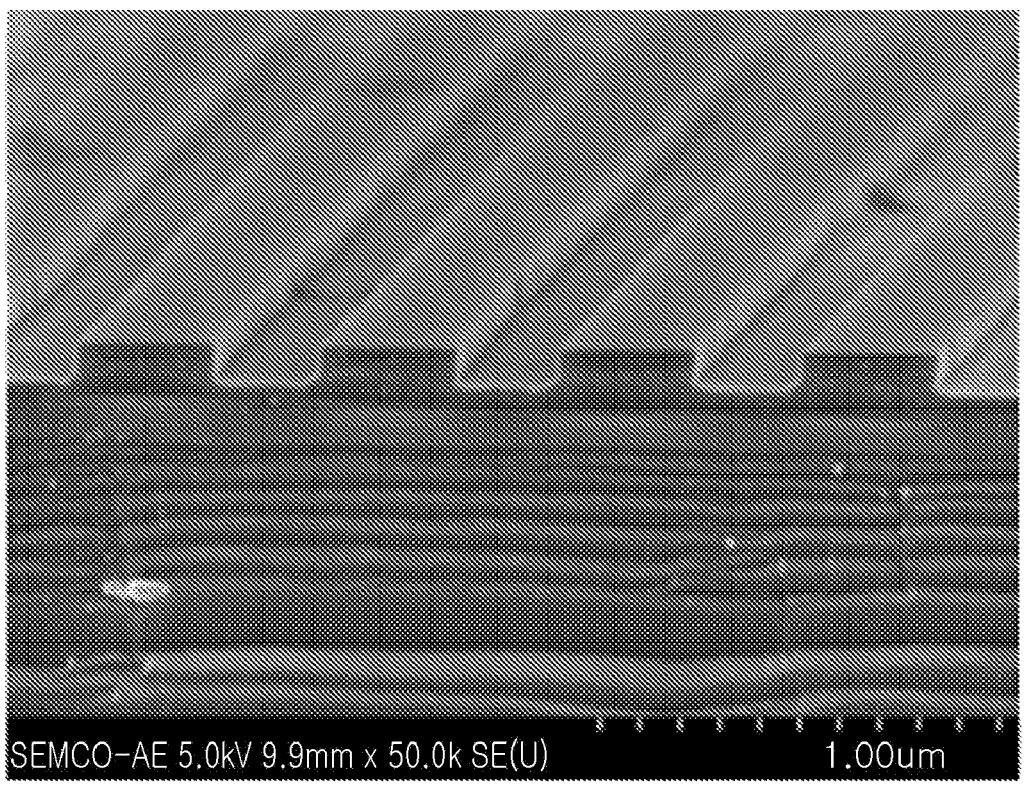
Figure 3C:
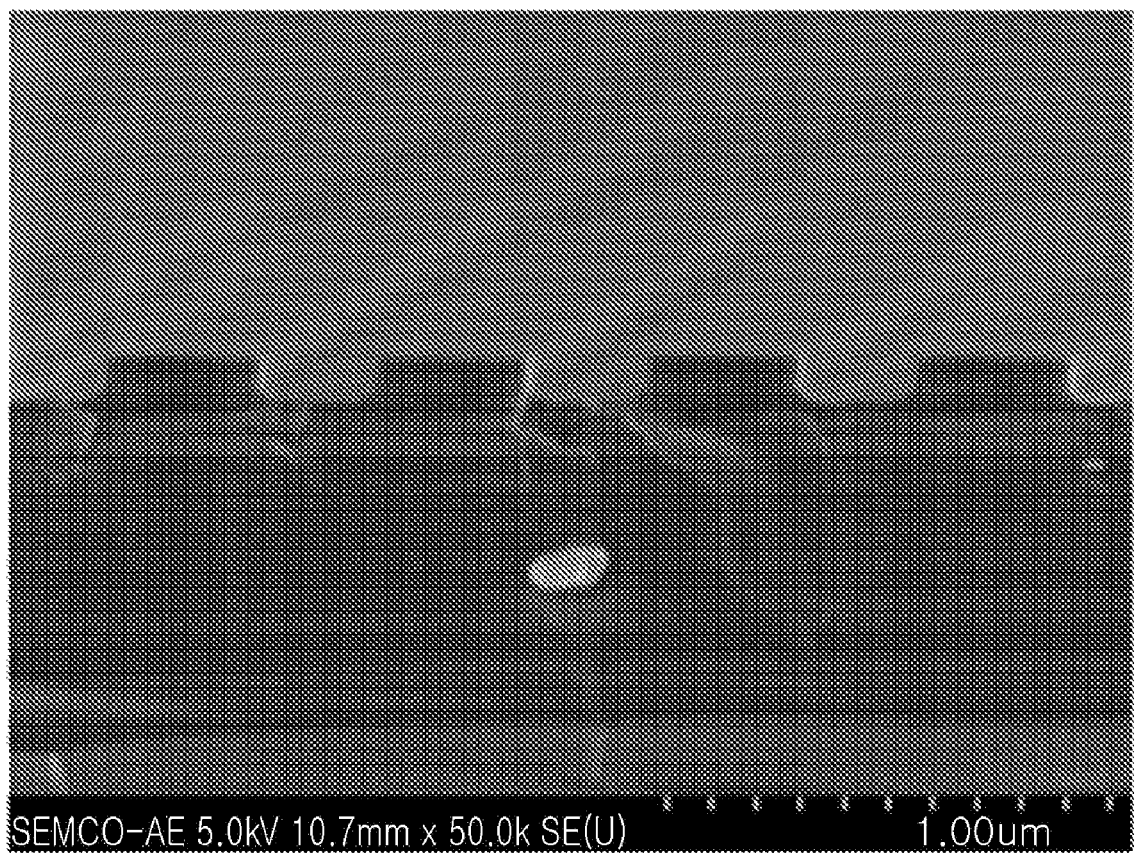

As a result of the wet etching performed for about ten minutes, an initial sidewall which is somewhat inclined becomes a vertical sidewall as shown in FIG. 3B. Since the sidewall becomes a {1-100} plane, which is a relatively stable crystal plane of GaN, i.e., an m-plane, the sidewall is no longer etched during the additional wet etching for about 20 minutes. Of course, a bottom surface, which is the stable c-plane is almost not etched.

According to the current embodiment, it can be seen that a damaged area resulting from the dry etching is removed from the sidewall and a portion of a bottom surface, and a clean crystal plane can be obtained. The crystal plane may secure excellent electrical contact in a semiconductor device.

Embodiment 1B

Figure 4A:
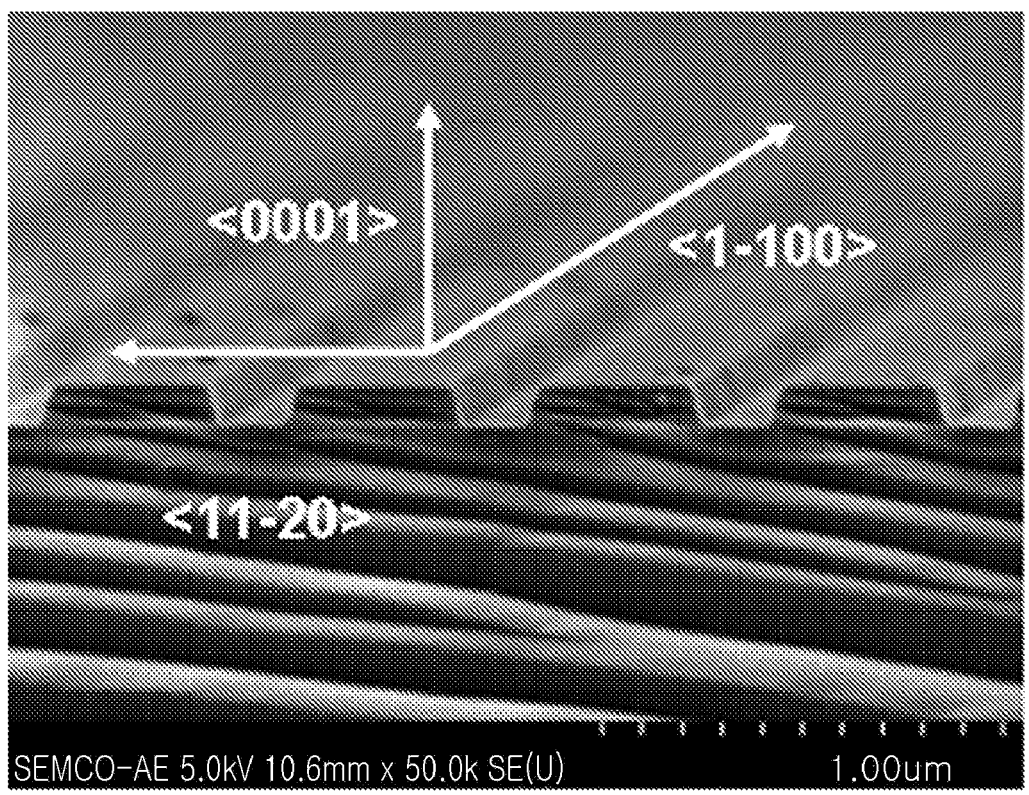
FIGS. 4A through 4D are SEM images showing pattern changes over time of horizontal wet etching in a fine-pattern forming process according to another exemplary embodiment (embodiment 1B) of the present invention.

According to this embodiment, similarly to the embodiment 1A, a mask having a plurality of line patterns (period: about 0.6 μm) is formed on a c-plane GaN semiconductor crystal. The difference there is a formation orientation and an arrangement orientation thereof. That is, according to the current embodiment, a plurality of line patterns are formed in a <1-100> orientation and arranged in a <11-20> orientation. Thereafter, dry etching is performed up to a depth of about 0.1 μm, and then the mask is removed (see FIG. 4A).

Figure 4B:
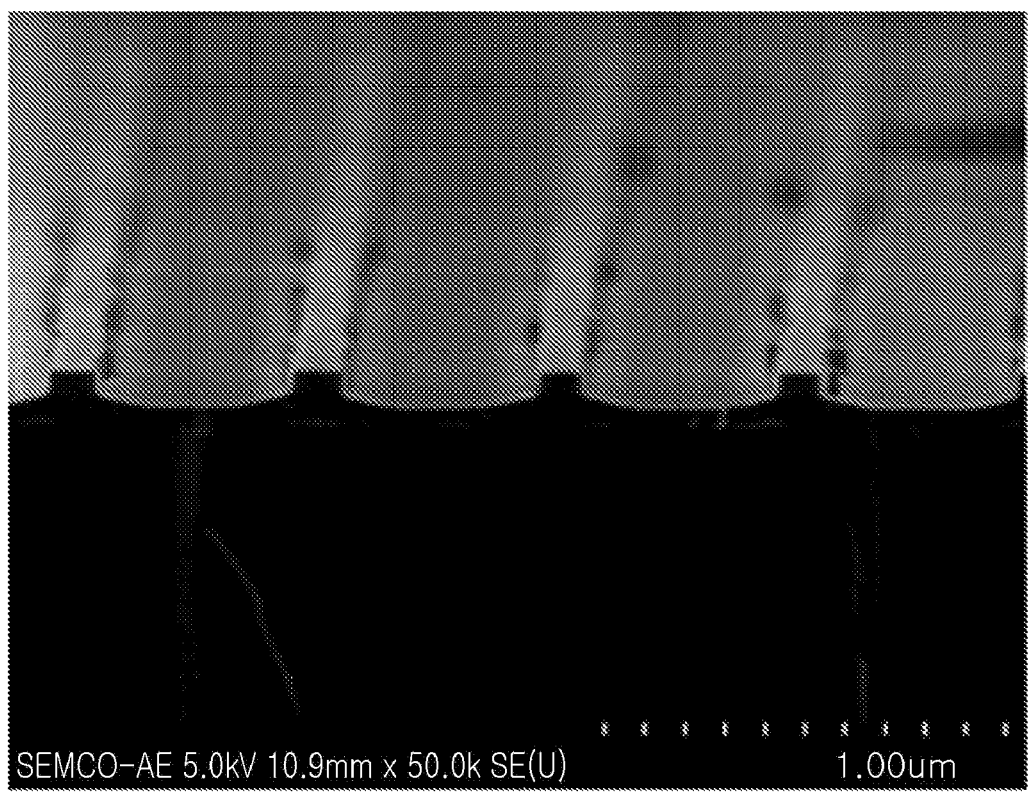

Thereafter, wet etching using a 4M KOH aqueous solution is performed at a temperature of about 100° C. for about 10 minutes, and a resulting structure is observed using an SEM (see FIG. 4B). Thereafter, the wet etching is performed thereon for about 20 minutes (total 30 minutes) and a resulting structure is observed using the SEM (see FIG. 4C). Thereafter, the wet etching is performed additionally for about 20 minutes (total 50 minutes) and a resulting structure is observed using the SEM (see FIG. 4D).

According to the current embodiment, a pattern resulting from the dry etching (see FIG. 4A) has a similar form to that in the embodiment 1A (see FIG. 3A).

Figure 4C:
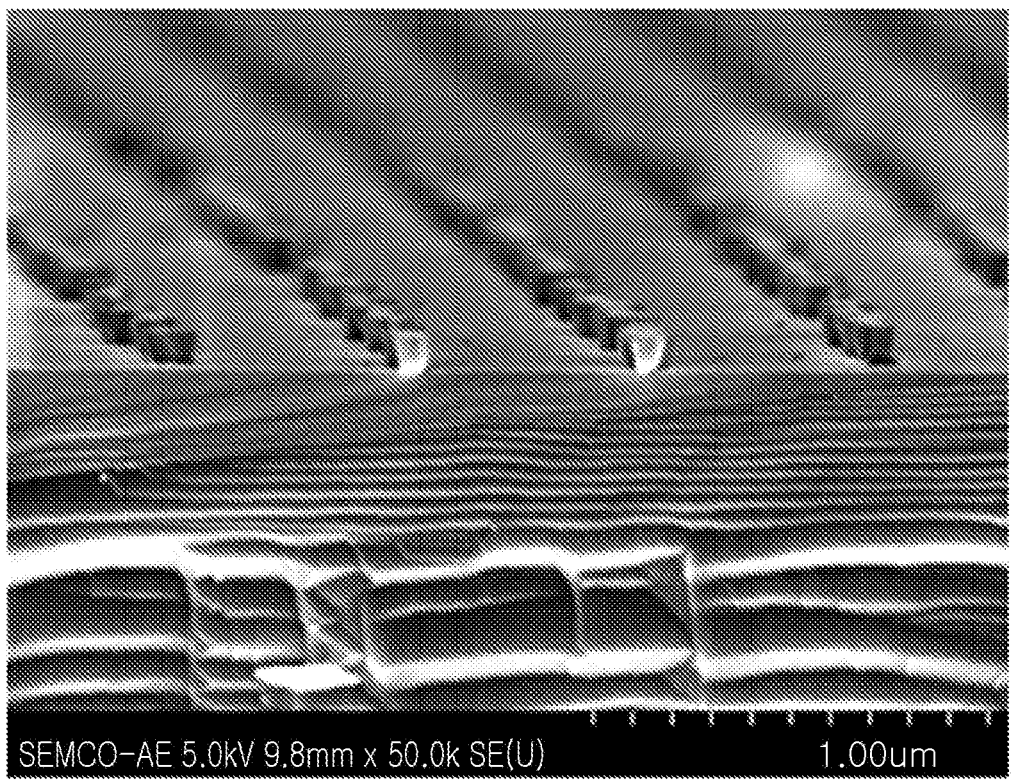
Figure 4D:
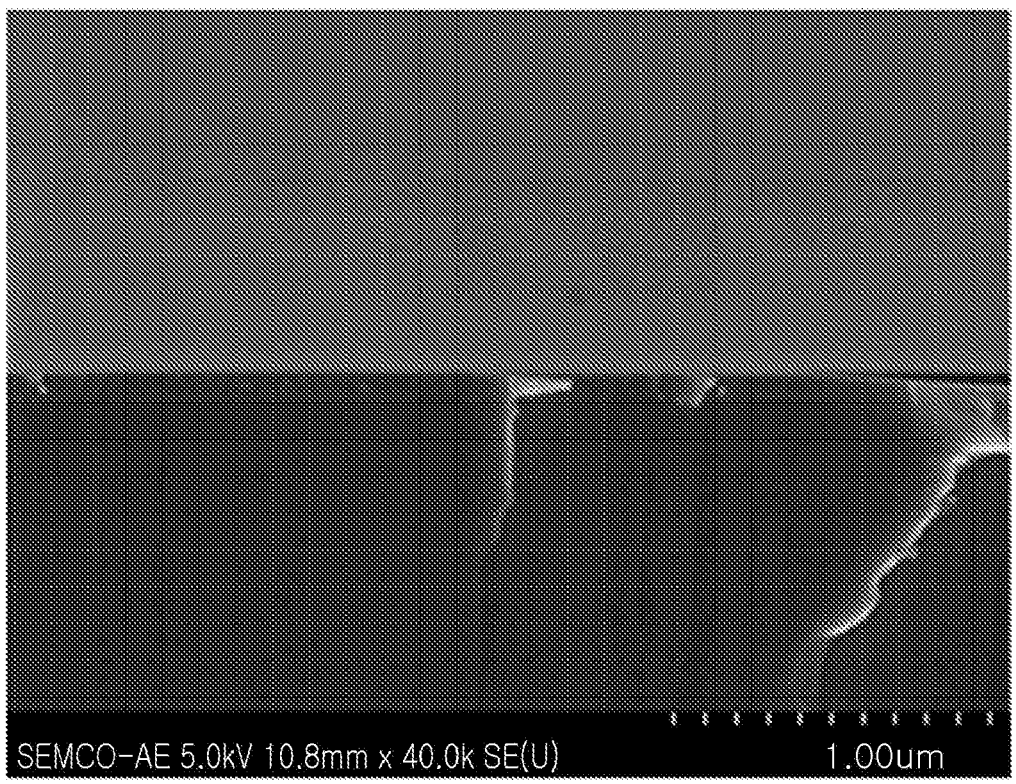

However, as shown in FIG. 4B, as horizontal wet etching proceeds, a width of the pattern is increased (i.e., a width of a pattern structure is gradually decreased). As the etching process proceeds for about 30 minutes or longer, the line patterns becomes dot patterns linearly arranged as shown in FIG. 4C. As the etching further proceeds, a completely flat plane remains (see FIG. 4D). This is because the patterns continuously change over time since the wet etching is performed at a relatively high etch rate in a <11-20> orientation as compared another stable crystal plane.

As described above, according to the current embodiment, one-dimensional grating and dot patterns may be provided, which vary in length and width and have relatively small damage.

As seen from the current embodiment (horizontal wet etching of a grating with a <1-100> orientation), it is possible to remove the c-plane, which is typically not wet-etched, to a predetermined thickness. That is, according to the present invention, dry etching is performed on a small area to form a groove, and horizontal wet etching is used as a subsequent process. It is also possible to reduce a thickness of an original epitaxial layer to a desired extent by controlling the etching depth of the initial dry etching.

Particularly, the surface of a p-type GaN layer cannot be dry-etched because of damage and cannot also be wet-etched because it is the c-plane. However, by using the process according to the current embodiment, the thickness of the p-type GaN layer can be reduced while a damaged portion thereof is minimized.

Embodiment 1C

Unlike the previous embodiments 1A and 1B, the current embodiment employs three-dimensional patterns. A plurality of circular mask patterns each having a size of about 0.3 μm are formed on a c-plane GaN semiconductor crystal. The plurality of circular mask patterns are arranged vertically and horizontally at a period of about 0.6 μm.

Figure 5:
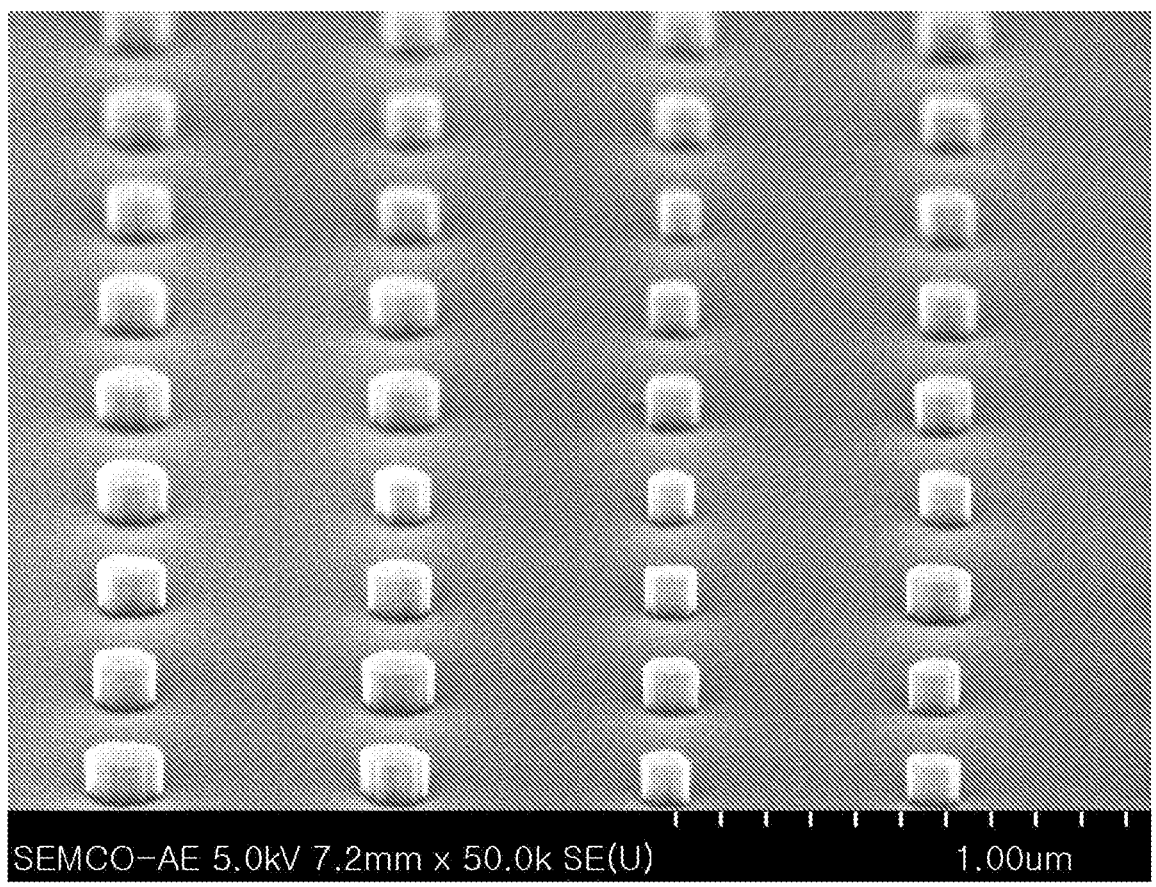
FIG. 5 is an SEM image of a three-dimensional pattern (pillar structure) obtained according to still another exemplary embodiment (embodiment 1C) of the present invention.

Thereafter, dry etching is performed up to a depth of about 0.1 μm, and then the mask is removed. Thereafter, wet etching using a 4M KOH aqueous solution is performed at about 100° C. for about 10 minutes and then a resulting structure is captured by using an SEM. As shown in FIG. 5, it can be seen that a three-dimension pattern such as a pillar structure (diameter: about 130 nm) is formed.

Embodiment 1D

According to the current embodiment, a three-dimensional pattern is employed as in the previous embodiment 1C, but a mask having a plurality of circular holes each having a size of about 100 nm is formed on a c-plane GaN semiconductor crystal. The plurality of circuit holes are arranged vertically and horizontally at a period of about 0.5 μm therebetween.

Figure 6A:
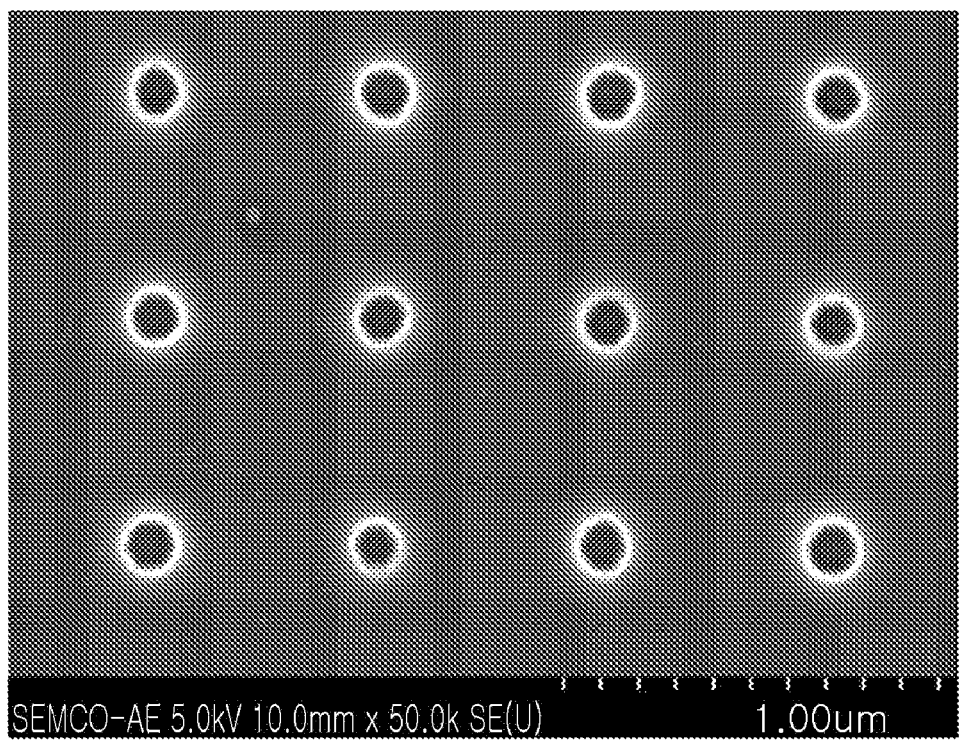
FIGS. 6A and 6B are SEM images of fine patterns after dry etching and after horizontal wet etching, respectively, in a fine-pattern forming process according to yet another exemplary embodiment (embodiment 1D) of the present invention.
Figure 6B:
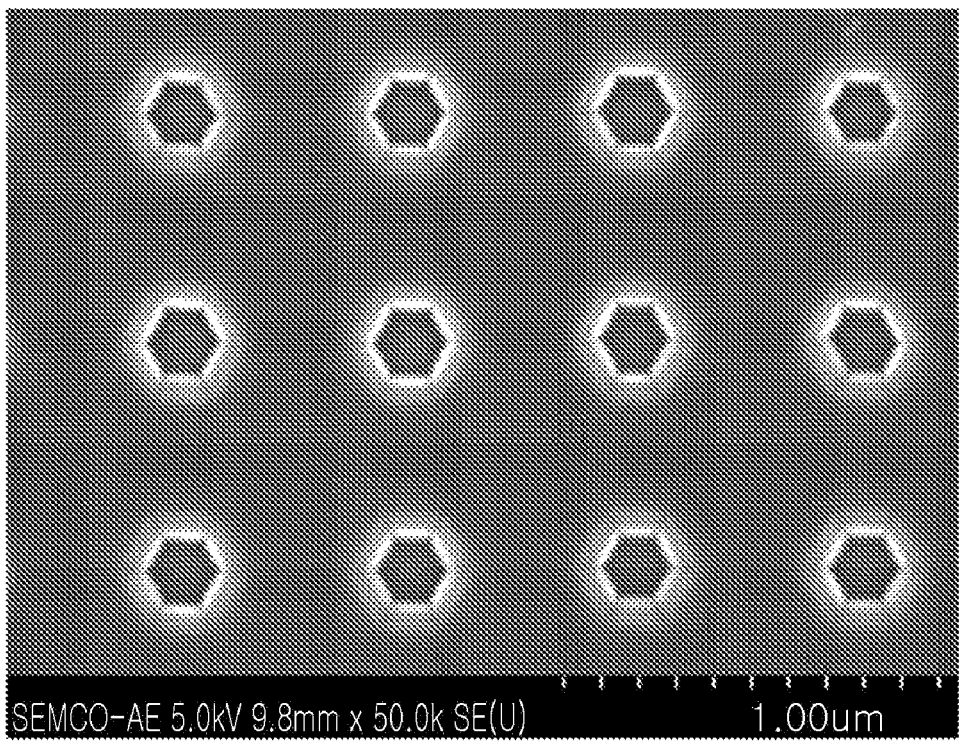

Dry etching (about 0.1 μm) is performed on the c-plane GaN surface by using the mask, thereby forming rough circular hole patterns, and then the mask is removed (see FIG. 6A). After the circular hole patterns are formed, wet etching using a 4M KOH aqueous solution is performed at about 108° C. for about 30 minutes. As shown in FIG. 6B, after fine patterns each having a hexagonal hole having each side parallel to a {1-100} m-plane are formed, the fine patterns are not etched any longer.

Embodiment 1E

The current embodiment is similar to the previous embodiment 1D except that a diameter of each of final holes is made to be greater in order to facilitate observation of changes in a crystal plane at a sidewall of the final hole. In the current embodiment, a period of the holes is the same as in the previous embodiment 1D, but the diameter of the hole is made to be greater.

Figure 7A:
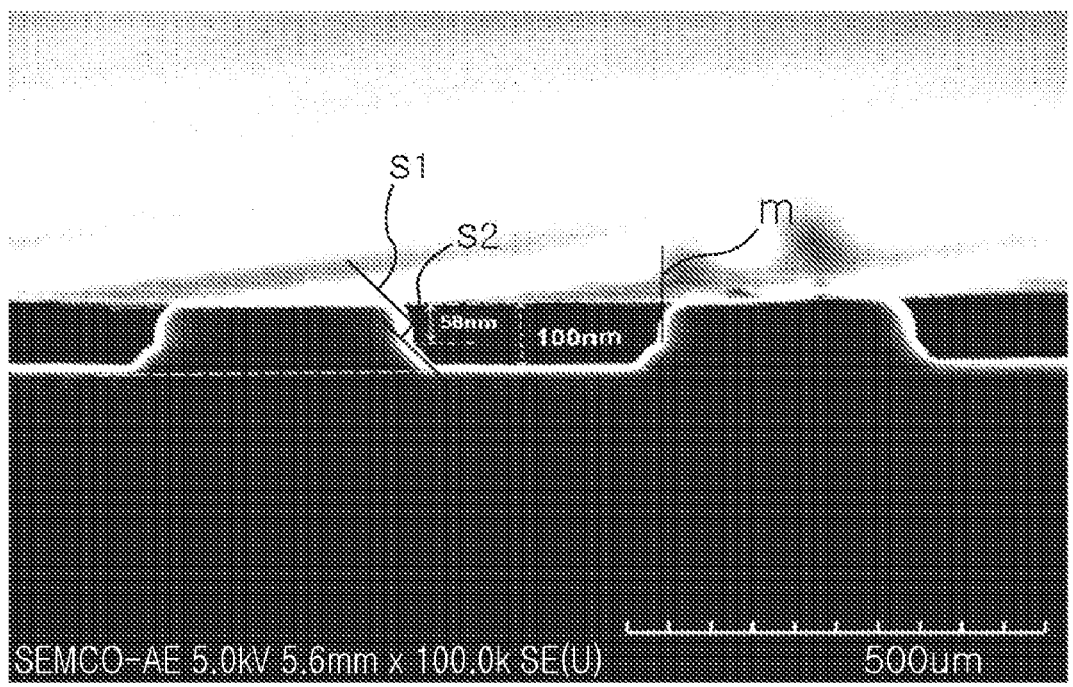
FIGS. 7A an 7B are SEM images showing pattern changes over time of horizontal wet etching in a fine-pattern forming process according to a further exemplary embodiment (embodiment 1E) of the present invention.
Figure 7B:
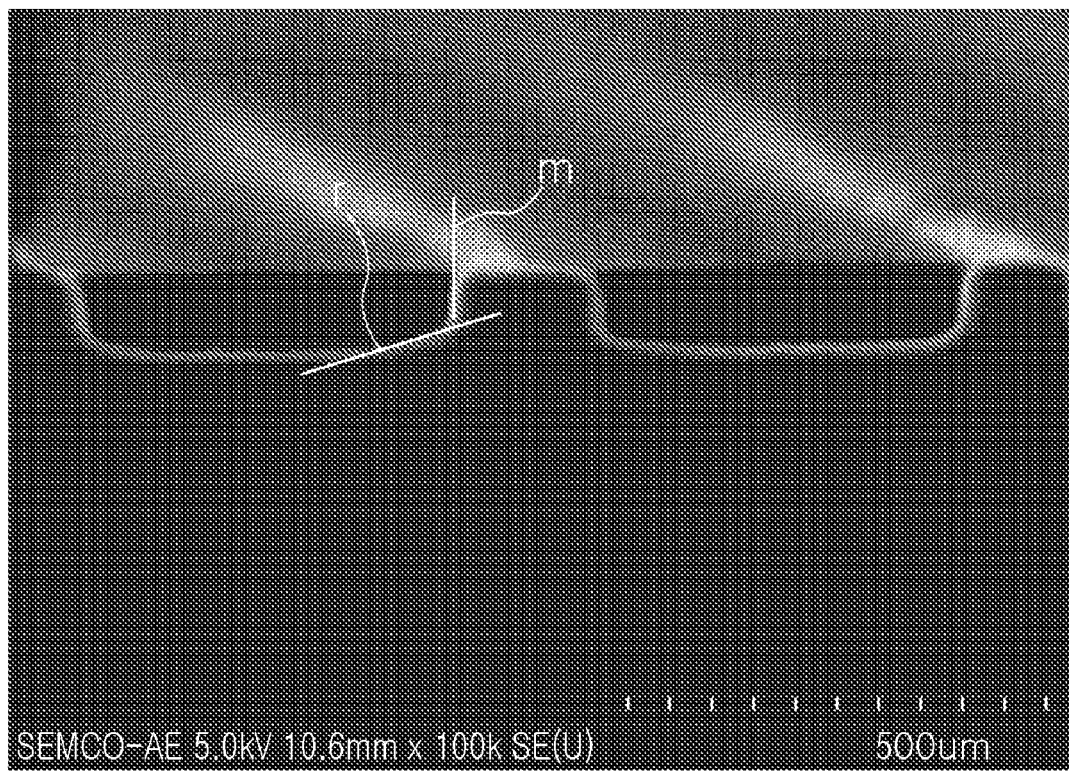

A section of a hexagonal hole resulting from the horizontal wet etching (100° C., 4M KOH aqueous solution) is captured as an SEM image. FIG. 7A illustrates a result of wet etching for about 10 minutes, and FIG. 7B illustrates a result of etching for 40 minutes.

As a result, as the wet etching proceeds, an area occupied by an s-plane which is relatively less stable decreases at a sidewall of the hole, and an area occupied by the m-plane increases. In more detail, it can be seen from FIG. 7A that a portion where the m-plane meets the c-plane which is a bottom surface is the s-plane but it is gradually changed to the r-plane and then the c-plane as the etching proceeds.

As a result of observing a section of a hexagonal hole over time of wet etching, it can be seen that as the wet etching proceeds, the shape of the sidewall resulting from the initial dry etching is changed until the stable crystal plane is gradually exposed. Particularly, the crystal plane of the inner sidewall of the hole may be constituted by a combination of the {0001} c-plane which is the bottom surface and the {1-101} s-plane, the {1-100} m-plane, the {1-102} r-plane or the like. Since the wet etching does not proceed in the c-plane direction, the depth of the hole does not change. However, it may be assumed that if the bottom surface has fine unevenness and inclination, they can be removed because of the horizontal etching operation.

As described above, as for the fine patterns obtained according to the present invention, crystal planes exposed by the horizontal etching are clean planes obtained by removing a portion damaged by the dry etching. Thus, when an electric contact layer is formed at the crystal plane, an excellent ohmic characteristic can be secured. Also, when an electrode material is deposited, a contact characteristic can be improved by adjusting a degree of slope of the crystal plane according to the crystal plane.

The fine-pattern forming process may be widely applied in forming a functional pattern of various semiconductor devices. Particularly, it may be advantageously applied to forming a pattern for improving light efficiency of a semiconductor light emitting device. An embodiment of FIG. 8A is associated with a nitride semiconductor light emitting device 80 which is an application example of a photonic crystal.

Figure 8A:
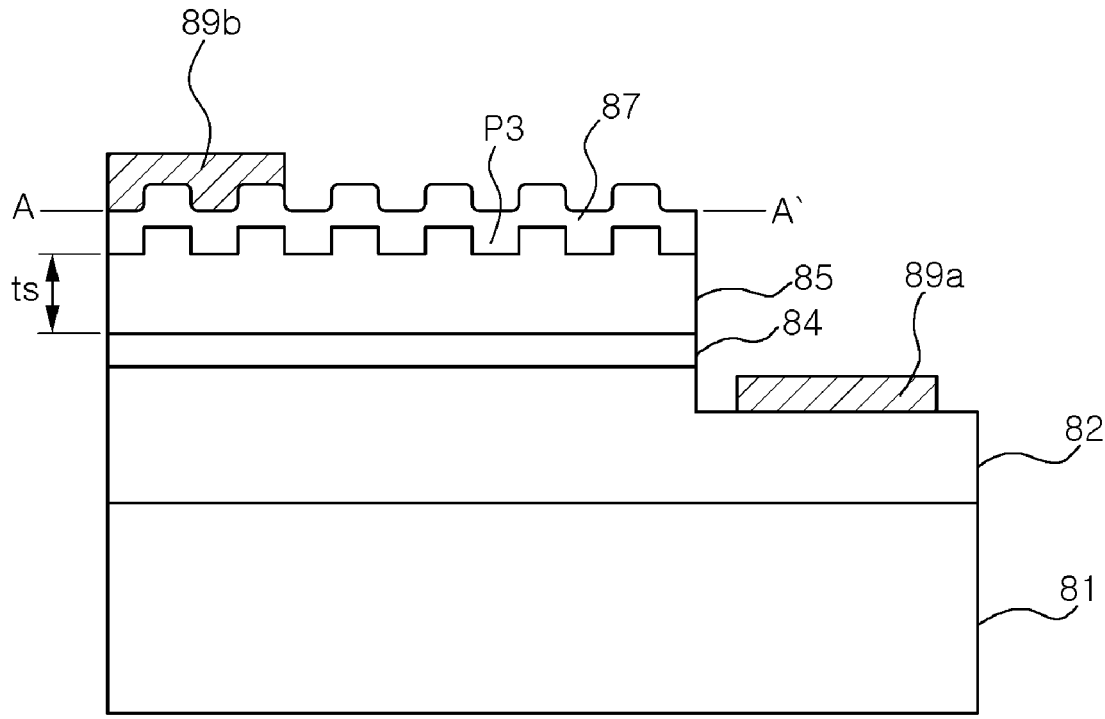
FIG. 8A is a cross-sectional view of a nitride semiconductor light emitting device (application example of a photonic crystal structure) obtained by a manufacturing method according to an exemplary embodiment of the present invention.

Referring to FIG. 8A, a nitride semiconductor light emitting device 80 includes a sapphire substrate 81, and an n-type nitride semiconductor layer 82, an active layer 84 and a p-type nitride semiconductor layer 85 sequentially formed on the sapphire substrate 81.

Also, the nitride semiconductor light emitting device 80 includes an n-side electrode 89a and a p-side electrode 89b. The n-side electrode 89a and the p-side electrode 89b are electrically connected to the n-type nitride semiconductor layer 82 and the p-type nitride semiconductor layer 85, respectively.

Periodic fine patterns P3 are formed on the p-type nitride semiconductor layer 85. The fine patterns P3 may be obtained through the process described with reference to FIGS. 2A through 2D (embodiment 1D). That is, as shown in FIG. 8B, hexagonal holes may be periodically arranged.

Figure 8B:
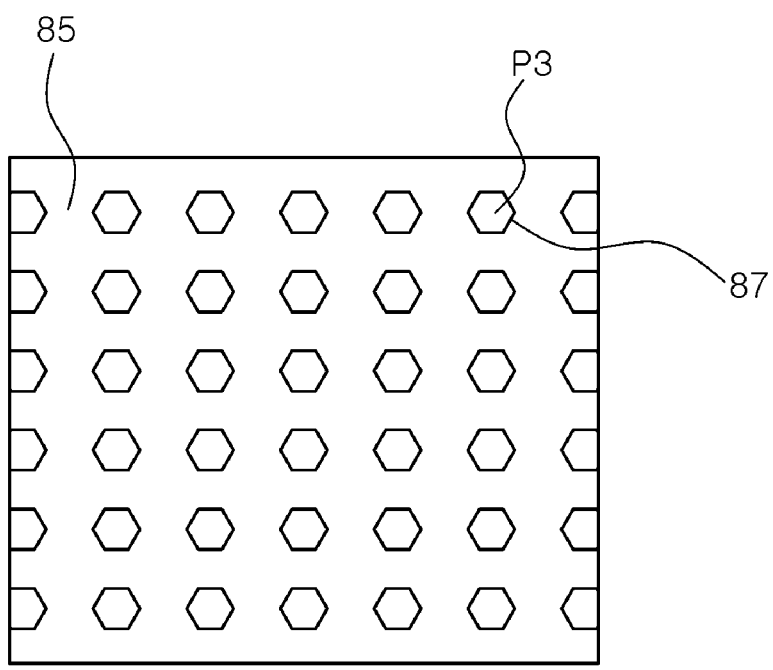
FIG. 8B is a plan view of a fine pattern layer taken along line A-A' of the nitride semiconductor light emitting device of FIG. 8A.

According to the current embodiment, as shown in FIGS. 8A and 8B, a light-transmissive conductive layer 87 is further formed on the p-type nitride semiconductor layer 85 including the periodic fine hole patterns P3. The light-transmissive conductive layer 87 may be formed of any material that has a light-transmissive property while securing ohmic contact. For example, a light-transmissive metal layer such as Ni/Au or a light-transmissive conductive oxide layer such as ITO may be used.

Also, a thickness ts of the p-type nitride semiconductor layer 85 may be 50 nm or less. If the thickness ts of the p-type nitride semiconductor layer 85 is excessively small, i.e., if the distance from the active layer 84 to a grating structure is excessively short, the leakage current drastically increases. For this reason, the thickness ts of the p-type nitride semiconductor layer 85 may be 10 nm or more.

The fine patterns P3 formed at the p-type nitride semiconductor layer 85 may serve as a photonic crystal structure that improves light extraction efficiency by attenuating a total reflection effect caused by a low refractive index of the ambient air or a sealant when light generated at the active layer 84 is extracted to the outside through a surface of the p-type nitride semiconductor layer 85.

The fine-pattern forming process according to the present invention may be implemented with high precision and excellent reproducibility because of an etch rate varying according a crystal plane even when wet etching is used. Accordingly, the fine-pattern forming process can be advantageously applied to the nitride semiconductor light emitting device having a photonic crystal structure illustrated in FIG. 8A.

Although the nitride semiconductor light emitting device is described in the current embodiment, the present invention is not limited thereto and may be applied to light emitting devices employing various known semiconductor materials.

Also, the embodiment of FIG. 8A uses a photonic crystal structure on a specific semiconductor layer such as a p-type nitride semiconductor layer. However, the embodiment of FIG. 8A may be advantageously applied to a method for forming periodic fine patterns employed for a surface Plasmon or a method for forming desired fine patterns while protecting a crystal surface even when non-periodic uneven patterns for light extraction are formed of different materials.

An embodiment 2 is associated with an experiment on a light emitting device having a photonic crystal and a result thereof.

Embodiment 2

According to the current embodiment, a nitride semiconductor light emitting device having an active layer including an InGaN multi-quantum well having a green wavelength is manufactured.

As for the light emitting device manufactured according to the current embodiment, a p-type GaN layer having a thickness of about 150 nm is dry-etched to a thickness of about 54 nm by using a mask having circular holes under similar conditions to those in the embodiment 1D, and then wet etching is performed thereon for about 10 minutes to form hexagonal hole patterns. Thereafter, similarly to the structure illustrated in FIG. 8A, a light-transmissive electrode oxide such as ITO is deposited on the p-type GaN layer as a light-transmissive electrode layer to form a p-side contact. Mesa-etching is performed thereon to partially expose an n-type GaN layer, and an n-side contact is formed on the exposed n-type GaN layer.

Figure 9:
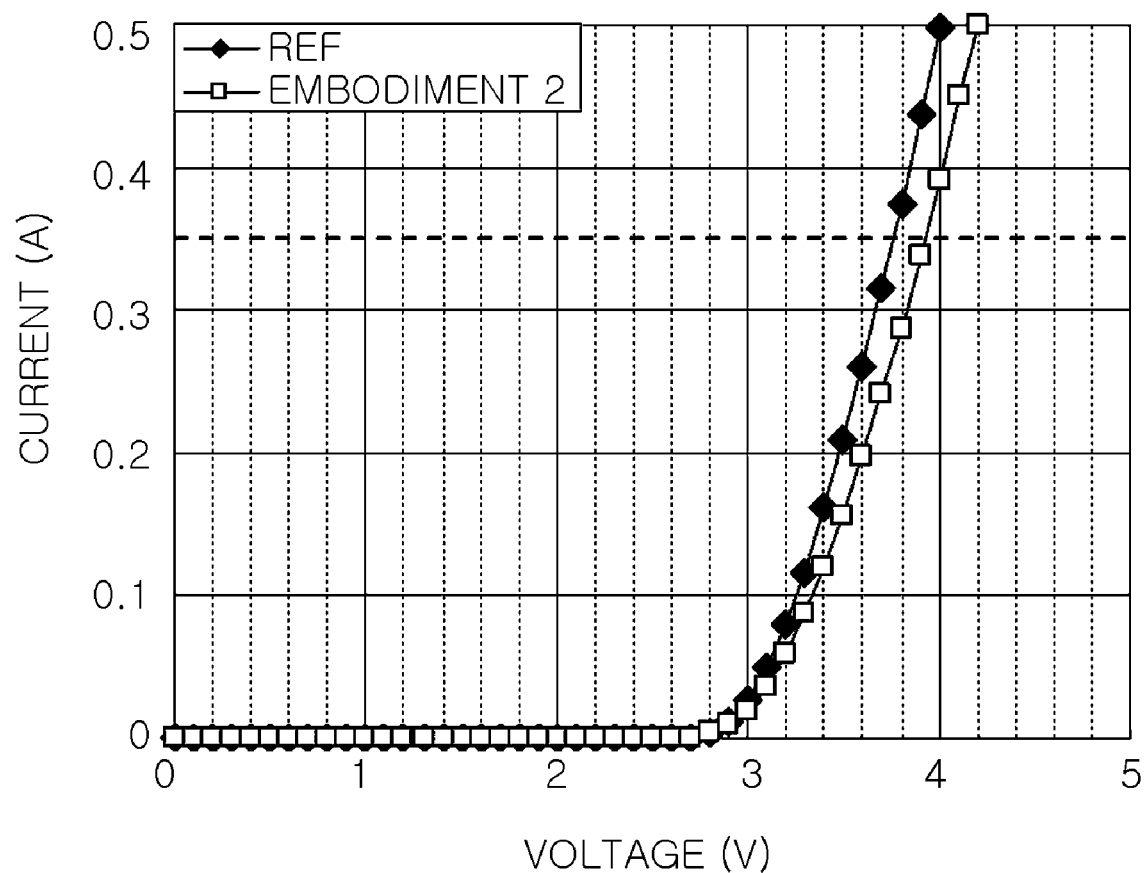
FIG. 9 is a graph showing an I-V curve of a nitride semiconductor light emitting device manufacture by a method of manufacturing a semiconductor light emitting device according to an exemplary embodiment (embodiment 2) of the present invention.
Figure 10:
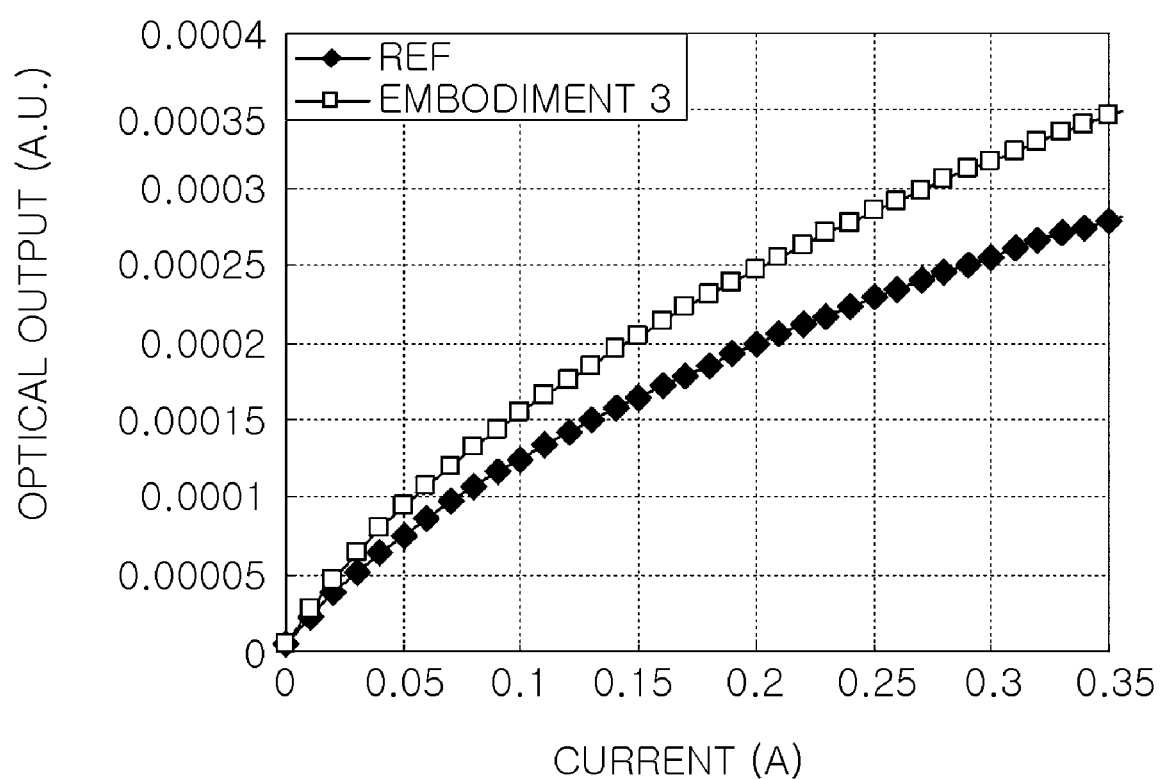
FIG. 10 is a graph showing optical output with respect to the current of the nitride semiconductor light emitting device manufactured by the method of manufacturing a semiconductor light emitting device according to the exemplary embodiment (embodiment 2) of the present invention.

In order to confirm improvement of electrical characteristics and luminance of a semiconductor light emitting device manufactured by a method according to the present invention, electrical characteristics and luminance of a nitride semiconductor light emitting device according to the embodiment 2 were measured. The results of the measuring are illustrated in FIGS. 9 and 10 in comparison with a reference example Ref. The reference example Ref is a result of a light emitting device in which only an Ag contact is disposed on a p-type nitride semiconductor layer and no patterns are formed thereon.

FIG. 9 is a graph showing an I-V curve of a nitride semiconductor light emitting device according to the current embodiment. FIG. 10 is a graph showing optical output with respect to the current of the nitride semiconductor light emitting device according to the current embodiment.

Figure 1:
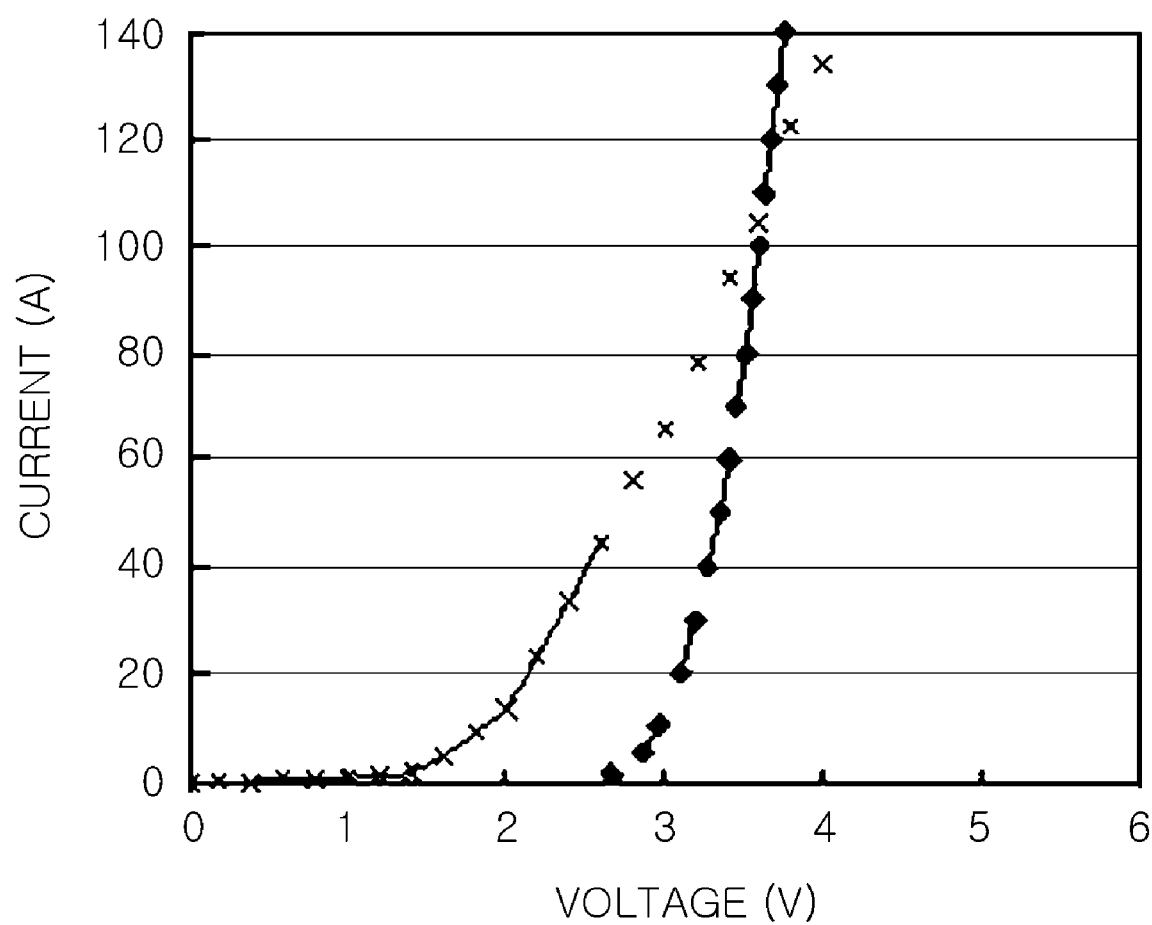
FIG. 1 is a graph showing a current-voltage (I-V) curve of a nitride semiconductor light emitting device including a p-type GaN layer damaged by dry etching.

As shown in FIG. 9, the nitride semiconductor light emitting device manufactured according to the embodiment 2 of the present invention has, unlike the nitride light emitting device of FIG. 1, an I-V characteristic where almost no leakage current is caused by a damaged crystal resulting from the dry etching. In comparison with the reference example Ref, the nitride semiconductor light emitting device has a higher voltage at the same current, but this difference is insignificant. An area ratio of a crystal plane obtained from the wet etching may be further increased, so that contact resistance can be improved and better electrical characteristics can be achieved as compared to the current embodiment.

FIG. 10 is a graph showing optical output with respect to the current of a nitride semiconductor light emitting device manufactured according to the current embodiment of the present invention.

As shown in FIG. 10, it can be seen that compared to the reference example Ref, the nitride semiconductor light emitting device according to the current embodiment achieves a luminance increase by about 24% at 350 mA because of a diffraction effect of a photonic crystal. That is, a photonic crystal pattern manufactured through an etching process according to the present invention is formed with a precise profile such that a portion of light confined by total reflection in an LED chip is diffracted to travel at an angle allowing emission to the outside of the chip. This can also significantly improve the luminance of the LED.

Figure 11:
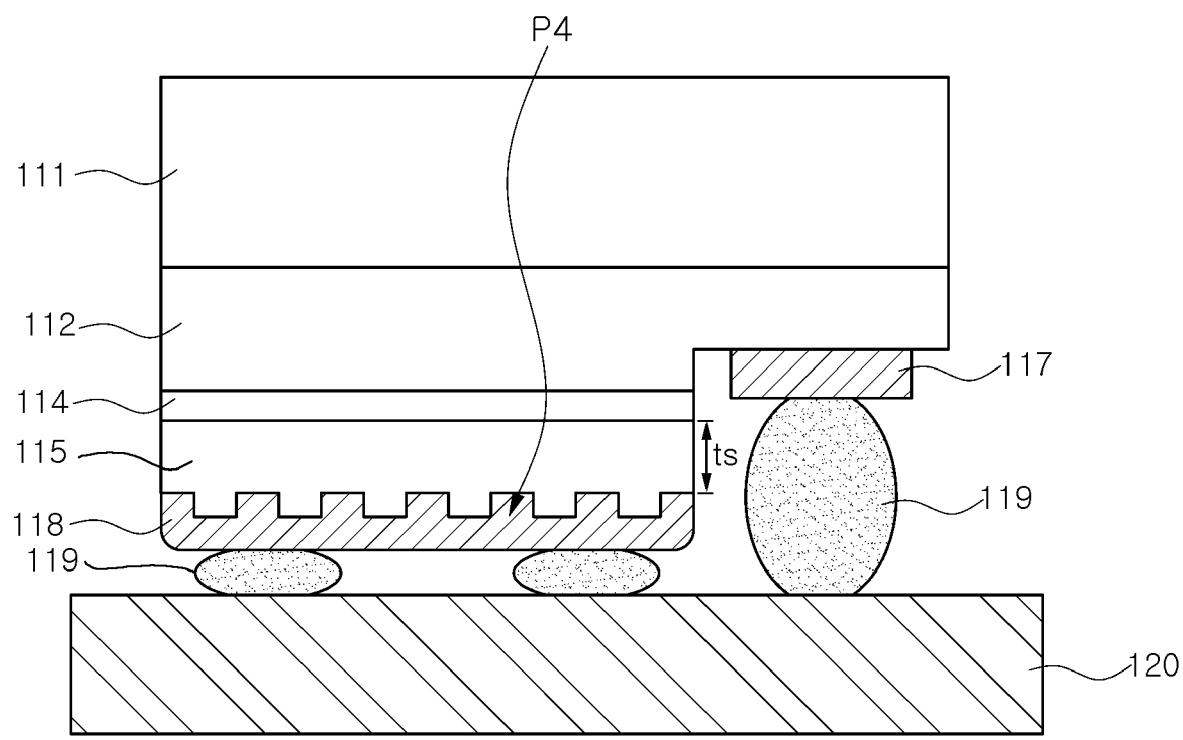
FIG. 11 is a cross-sectional view of a nitride semiconductor light emitting device (application example of a surface plasmon resonance structure) obtained by a manufacturing method according to another exemplary embodiment of the present invention.

FIG. 11 is a side sectional view of a nitride semiconductor light emitting device obtained by a manufacturing method of the present invention, which is an application example of a resonance principle of a surface plasmon.

A surface plasmon used in this application is a collective charge density oscillation of electrons occurring at a surface of a metal thin film. A surface plasmon wave generated by the collective charge density oscillation is a surface electromagnetic wave propagating along a boundary surface between a metal and a dielectric. When coupling occurs between the surface plasmon and an active layer, spontaneous emission occurring at the active layer is increased by the surface plasmon, and a large portion of light generated by the spontaneous emission is excited to generate the surface plasmon. A semiconductor light emitting device adopting this principle to improve efficiency thereof may be called a surface plasmon semiconductor light emitting device.

Referring to FIG. 11, a surface plasmon nitride semiconductor light emitting device 110 is mounted on a submount substrate 120 by soldering. The surface plasmon nitride semiconductor light emitting device 110 includes a nitride semiconductor sapphire substrate 111, and an n-type nitride semiconductor layer 112, an active layer 114 and a p-type nitride semiconductor layer 115 sequentially disposed on the nitride semiconductor sapphire substrate 111.

Also, the nitride semiconductor light emitting device 110 includes an n-side electrode 117 and a p-side electrode 118 respectively electrically connected to the n-type nitride semiconductor layer 112 and the p-type nitride semiconductor layer 115.

Fine patterns P4 having periodicity are formed on the p-type nitride semiconductor layer 115. These fine patterns P4 may be hexagonal hole patterns arranged periodically, which are obtained by the process (embodiment 1D) explained with reference to FIGS. 2A through 2D.

According to the current embodiment, as shown in FIG. 11, a highly-reflective metal layer is formed as the p-side electrode 118 on the p-type nitride semiconductor layer 115 including the periodic fine hole patterns P4. The highly reflective metal layer may be formed of a material that has a predetermined reflectance while securing ohmic contact. For example, the highly reflective metal layer may be formed of a mono- or multilayered metal material such as Al, Ag, Au, Cr, Ni, Pd and Pt.

Also, a distance between the active layer 114 and the highly reflective metal layer is very important in causing surface plasmon resonance. Accordingly, the p-type nitride semiconductor layer 115 is required to have a sufficient thickness to allow light emitted from the active layer 114 to excite the surface plasmon at an interface between the p-type nitride semiconductor layer 115 and the highly reflectively metal layer.

The thickness ts of the p-type nitride semiconductor layer 115 may be less than about 50 nm. If the thickness ts of the p-type nitride semiconductor layer 115 is not sufficient, i.e., the distance from the active layer 114 to a grating structure is excessively short, a drastic increase in leakage current occurs. For this reason, the p-type nitride semiconductor layer 115 may have a thickness ts of 10 nm or greater.

According to the current embodiment, the surface Plasmon resonance may be employed for a light emitting device to improve light emission efficiency.

In this configuration, fine patterns P4 having a periodic grating structure are necessary at an interface between the p-type nitride semiconductor layer 115 and the highly reflective metal layer in order to reconvert the excited surface Plasmon into light. Particularly, a precise interval and size of the fine patterns P4 are determined based on a wavelength generated from the active layer 114.

In this regard, dry etching is preferable. However, as described previously, the distance between the active layer 114 and the highly reflective metal layer is very important among various conditions for causing the surface plasmon resonance, such as a wavelength of incident light and a refractive index of a material contacting metal. Because the distance is generally 50 nm or less, which is relatively short, damage to the p-type nitride semiconductor layer 115 caused by the dry etching may cause serious limitations. However, the fine-pattern forming process according to the present invention can minimize a damaged portion remaining in the fine patterns P4 at the final stage. Also, even if wet etching is used, the fine-pattern forming process according to the present invention can achieve high precision and excellent reproducibility because of an etch rate varying according to the crystal plane. Accordingly, the fine-pattern forming process according to the present invention may be advantageously applied to the surface plasmon nitride semiconductor light emitting device illustrated in FIG. 11.

Embodiment 3

According to the current embodiment, similarly to the embodiment 2, a nitride semiconductor light emitting device having an active layer of an InGaN multi-quantum well with a green wavelength is manufactured.

The LED manufactured according to the current embodiment includes hexagonal hole patterns formed by performing dry etching to a depth of about 33 nm using a mask having circular holes on a p-type GaN layer with a thickness of about 66 nm under similar conditions to those of the embodiment 1D and then performing wet etching for about 10 minutes. Thereafter, similarly to a structure illustrated in FIG. 11, a p-side contact is formed by depositing a multilayered metal electrode including a highly reflective material layer, which is an Ag layer on the p-type GaN layer, and an n-side contact is formed on an n-type GaN layer by performing mesa etching to partially expose the n-type GaN layer.

Figure 12:
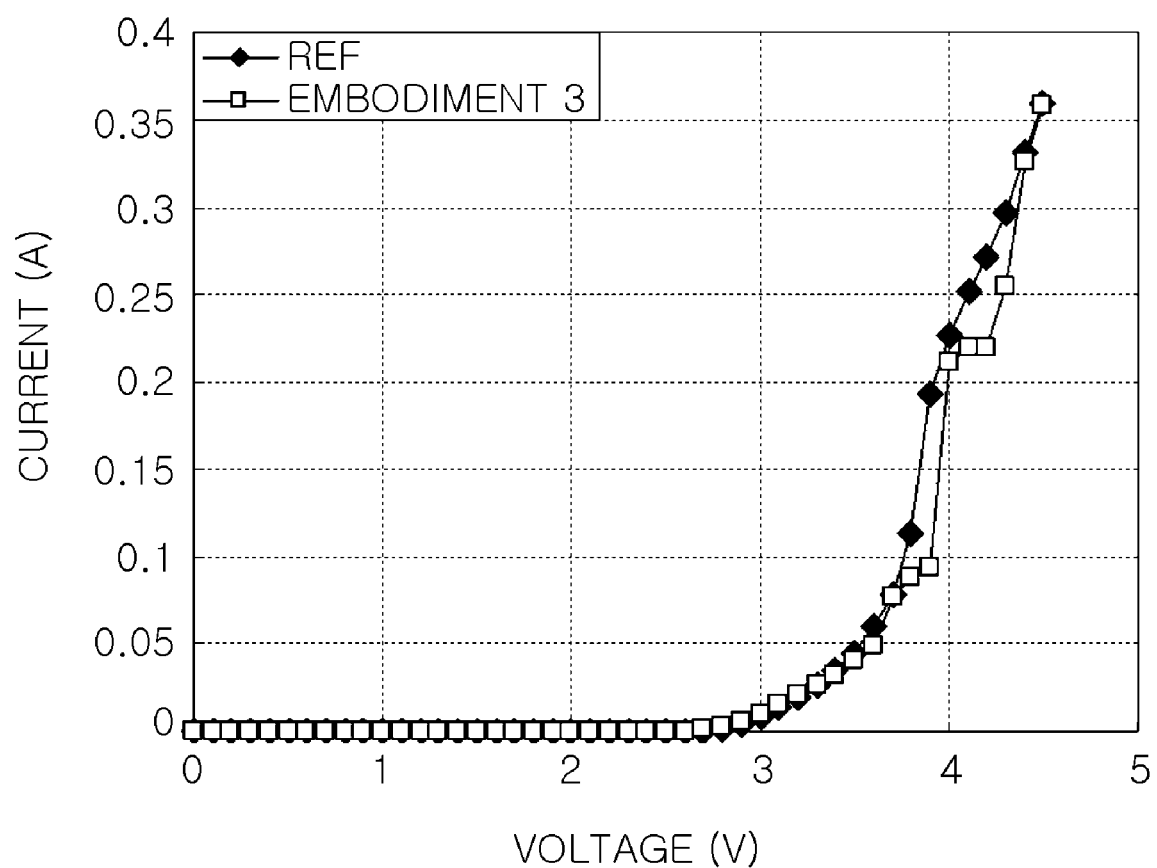
FIG. 12 is a graph showing an I-V curve of a nitride semiconductor light emitting device manufactured by a method of manufacturing a semiconductor light emitting device according to another exemplary embodiment (embodiment 3) of the present invention.
Figure 13:
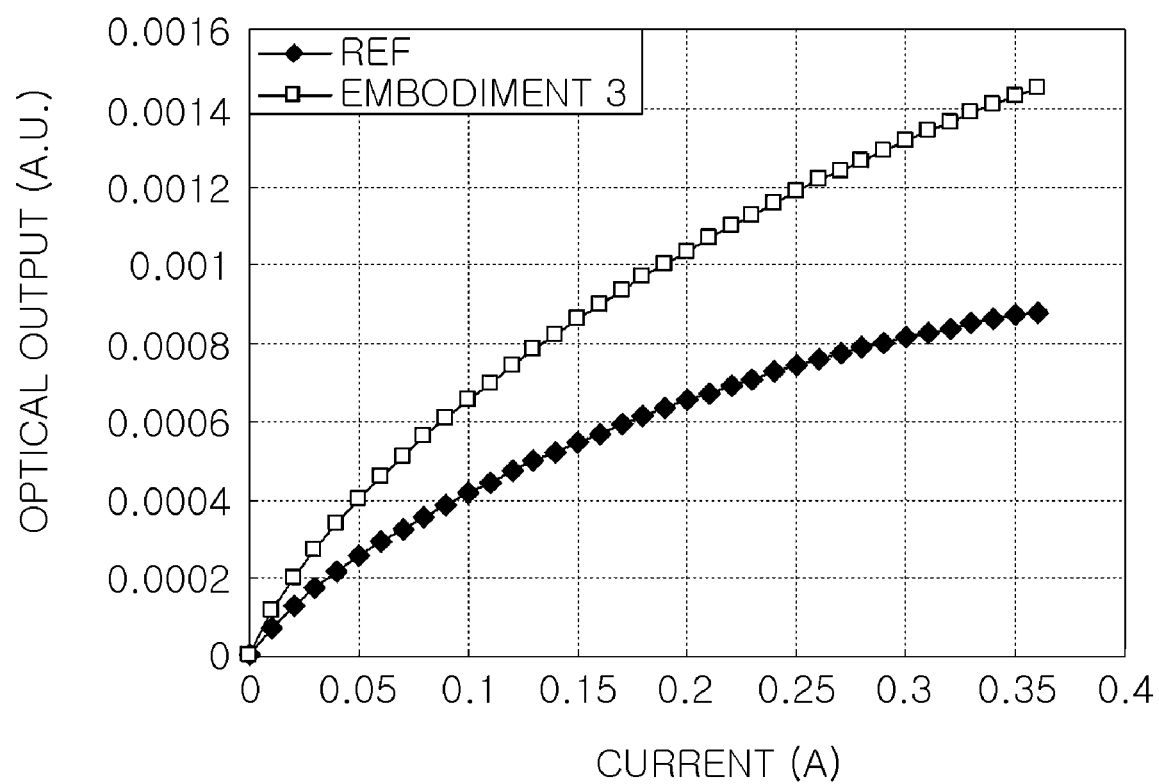
FIG. 13 is a graph showing optical output with respect to the current of the nitride semiconductor light emitting device manufactured by the method of manufacturing a semiconductor light emitting device according to another exemplary embodiment (embodiment 3) of the present invention.

In order to check improvement of electrical characteristics and luminance of the nitride semiconductor light emitting device manufactured according to a method of the present invention, improvement of the electrical characteristics and luminance of the nitride semiconductor light emitting device obtained according to the embodiment 3 were measured. The results of the measuring are shown in FIGS. 12 and 13 in comparison with a reference example Ref. Here, the reference example is a result of a light emitting device structure which includes a multilayered metal electrode which is identical to that of the embodiment 3, without including patterns on a p-type nitride semiconductor layer.

FIG. 12 is a graph showing an I-V curve of the nitride semiconductor light emitting device according to the current embodiment. FIG. 13 is a graph showing optical output with respect to the current of the nitride semiconductor light emitting device according to the current embodiment.

It can be seen from FIG. 12 that, as seen from FIG. 1, the nitride semiconductor light emitting device manufactured according to the embodiment 3 of the present invention has an I-V characteristic in which almost no leakage current is generated at the time of dry etching. However, somewhat irregular curves are observed on the I-V curve of the current embodiment that has a very thin p-type nitride semiconductor layer as compared to a general nitride semiconductor light emitting device.

In comparison with the reference example Ref, the nitride semiconductor light emitting device according to the current embodiment has almost constant voltage at the same current. Better electrical characteristics than those in the current embodiment may be expected by increasing an area ratio of the crystal plane obtained from the wet etching and thus improving contact resistance.

FIG. 13 is a graph showing optical output with respect to the current of a nitride semiconductor light emitting device according to the embodiment 3 of the present invention.

It can be seen from FIG. 13 that as compared to the reference example Ref, the nitride semiconductor light emitting device according to the current embodiment has luminance improved by about 64% at a current of 350 mA because of the surface plasmon resonance effect. That is, the fine grating structure manufactured using an etching process according to the present invention is formed with a precise profile, so that energy of an electron-hole pair injected to a multi-quantum well within an LED chip is converted into light through the medium of the surface plasmon, and the light is emitted to the outside of the LED chip.

Also, a portion of light generated by self-emission without using the surface plasmon as the medium and confined by total reflection is diffracted to convert a propagation direction of the light to an angle allowing emission of the light to the outside of the chip. Thus, luminance of the light emitting device can also be significantly improved.

According to the present invention, only a minimum portion of a desired pattern area is dry-etched and then wet-etching is performed in a horizontal direction to form a structure, so that damage caused in the dry etching can be minimized. Also, a crystal orientation (pattern forming direction) and wet-etching conditions (conditions such as time) are properly controlled, so that high reproducibility of fine patterns can be secured while the height and the size of fine patterns are freely controlled. A semiconductor light emitting device with excellent light efficiency can be provided by applying such fine patterns to a photonic crystal structure or a structure employing a surface plasmon principle.

Also, a specific geometric shape of the fine patterns according to the present invention is formed naturally according to the hexagonal crystal system during the subsequent wet etching process. Thus, the fine patterns have unique crystal planes such as the c-plane, the m-plane, the s-plan and/or the r-plane where almost no damage occurs. Since the crystal plane may directly contact an electrode layer of metal or conductive oxide in the semiconductor light emitting device, it is more advantageous in forming a p-type ohmic contact.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of forming a fine pattern, the method comprising:
   providing a c-plane hexagonal semiconductor crystal;
   forming a mask having a predetermined pattern on the semiconductor crystal;
   dry-etching the semiconductor crystal by using the mask to form a first fine pattern on the semiconductor crystal; and
   wet-etching the semiconductor crystal including the first fine pattern to form a second fine pattern by expanding the wet-etching from an inside sidewall of the first fine pattern in a horizontal direction,
   wherein the second fine pattern obtained in the wet-etching the semiconductor crystal has a bottom surface and a sidewall that have unique crystal planes, respectively.

2. The method of claim 1, wherein the semiconductor crystal substrate is formed of a p-type nitride semiconductor.

3. The method of claim 1, wherein a bottom surface obtained in the forming a first fine pattern has the same c-plane that a bottom surface obtained in the forming a second fine pattern has.

4. The method of claim 3, wherein the pattern of the mask comprises a plurality of line patterns formed in a <11-20> orientation of the semiconductor crystal and arranged along a <1-100> orientation, and
   the sidewall of the second fine pattern has an m-plane.

5. The method of claim 3, wherein the pattern of the mask comprises a plurality of line patterns formed in a <1-100> orientation of the semiconductor crystal and arranged in a <11-20> orientation.

6. The method of claim 3, wherein the pattern of the mask comprises a plurality of fine holes, and
   the second fine pattern comprises a plurality of hexagonal fine holes.

7. A method of forming a fine pattern, the method comprising:
  providing a c-plane hexagonal semiconductor crystal;
  forming a mask having a predetermined pattern on the semiconductor crystal;
  dry-etching the semiconductor crystal by using the mask to form a first fine pattern on the semiconductor crystal; and
  wet-etching the semiconductor crystal including the first fine pattern from an inside sidewall to expand the first fine pattern in a horizontal direction to form a second pattern,
  wherein the second fine pattern obtained in the wet-etching the semiconductor crystal has a bottom surface and a sidewall that have unique crystal planes, respectively,
  wherein the forming a second fine pattern comprises performing wet-etching such that the sidewall of the second fine pattern has an m-plane component and an s-plane component.

8. The method of claim 6, wherein the forming a second fine pattern comprises performing wet-etching such that the sidewall of the second fine pattern includes an r-plane component.

9. The method of claim 3, wherein the second fine pattern has a pillar structure.

10. The method of claim 1, wherein the forming a second fine pattern is performed after the mask is removed.

11. The method of claim 1, wherein the forming a second fine pattern is performed before the mask is removed.

12. A method of manufacturing a semiconductor light emitting device, the method comprising:
  providing a multilayered semiconductor structure including a first conductivity type semiconductor layer, a second conductivity type semiconductor layer, and an active layer between the first and second conductivity type semiconductor layers;
  forming a mask having a predetermined pattern on the second conductivity type semiconductor layer of the multilayered semiconductor structure;
  dry-etching the second conductivity type semiconductor layer by using the mask to form a first fine pattern on the second conductivity type semiconductor layer;
  wet-etching the second conductivity type semiconductor layer including the first fine pattern to form a second fine pattern by expanding the wet-etching from an inside sidewall of the first fine pattern in a horizontal direction; and
  forming a first electrode and a second electrode in a state where the mask has been removed, the first and second electrode respectively being connected with the first and second conductivity type semiconductor layers,
  wherein the second conductivity type semiconductor layer is a c-plane hexagonal semiconductor crystal, and the second fine pattern obtained from the wet-etching the second conductivity type semiconductor layer has a bottom surface and a sidewall that have unique crystal planes, respectively.

13. The method of claim 12, wherein the forming a second electrode comprises forming a transparent electrode layer on the second conductivity type semiconductor layer including the second fine pattern.

14. The method of claim 12, wherein the forming a second electrode comprises forming a highly reflective metal layer on the second conductivity type semiconductor layer including the second fine pattern.

15. The method of claim 14, wherein the second conductivity type semiconductor layer has a thickness allowing light emitted at the active layer to excite a surface plasmon at an interface between the second conductivity type semiconductor layer and the highly reflectively metal layer.

16. The method of claim 14, wherein the second conductivity type semiconductor layer has a thickness of about 50 nm or less.

17. The method of claim 12, wherein the multilayered semiconductor structure is formed of a nitride semiconductor, and
  the first conductivity type semiconductor layer and the second conductivity type semiconductor layer are an n-type nitride semiconductor layer and a p-type nitride semiconductor layer, respectively.

18. The method of claim 17, wherein a bottom surface obtained in the forming a first fine pattern has the same c-plane that the bottom surface obtained in the forming a second fine pattern has.

19. The method of claim 18, wherein the pattern of the mask comprises a plurality of line patterns formed in a <11-20> orientation of the semiconductor crystal and arranged along a <1-100> orientation, and
  the sidewall of the second fine pattern has an m-plane.

20. The method of claim 18, wherein the pattern of the mask comprises a plurality of line patterns formed in a <1-100> orientation of the semiconductor crystal and arranged along a <11-20> orientation.

21. The method of claim 18, wherein the pattern of the mask comprises a plurality of fine holes, and
  the second fine pattern comprises a plurality of fine hexagonal holes.

22. A method of forming a fine pattern, the method comprising:
  providing a c-plane hexagonal semiconductor crystal;
  forming a mask having a predetermined pattern on the semiconductor crystal;
  dry-etching the semiconductor crystal by using the mask to form a first fine pattern on the semiconductor crystal; and
  wet-etching the semiconductor crystal including the first fine pattern from an inside sidewall to expand the first fine pattern in a horizontal direction to form a second pattern,
  wherein the second fine pattern obtained in the wet-etching the semiconductor crystal has a bottom surface and a sidewall that have unique crystal planes, respectively,
  wherein the forming a second fine pattern comprises performing wet-etching such that the sidewall of the second fine pattern has an m-plane component and an s-plane component.

23. The method of claim 21, wherein the forming a second fine pattern comprises performing wet-etching such that the sidewall of the second fine pattern has an r-plane component.

24. The method of claim 13, wherein the second fine pattern has a pillar structure.

25. The method of claim 13, wherein the mask is removed between the forming a first fine pattern and the forming a second fine pattern.

26. The method of claim 13, wherein the mask is removed after the forming a second fine pattern.

* * * * *